United States Patent

Katayama

(10) Patent No.: US 10,566,993 B2
(45) Date of Patent: Feb. 18, 2020

(54) DELTA-SIGMA MODULATOR AND DELTA-SIGMA CONVERTER

(71) Applicant: Asahi Kasei Microdevices Corporation, Tokyo (JP)

(72) Inventor: Takato Katayama, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 0 days.

(21) Appl. No.: 16/219,947

(22) Filed: Dec. 14, 2018

(65) Prior Publication Data

US 2019/0199369 A1    Jun. 27, 2019

(30) Foreign Application Priority Data

Dec. 26, 2017 (JP) .................. 2017-249515
Dec. 6, 2018 (JP) .................. 2018-229101

(51) Int. Cl.
*H03M 3/00* (2006.01)
*H03F 3/45* (2006.01)
*H03F 3/217* (2006.01)

(52) U.S. Cl.
CPC .......... *H03M 3/43* (2013.01); *H03F 3/45475* (2013.01); *H03M 3/364* (2013.01); *H03M 3/37* (2013.01); *H03M 3/39* (2013.01); *H03M 3/424* (2013.01); *H03M 3/45* (2013.01); *H03F 3/2175* (2013.01); *H03F 2203/45526* (2013.01); *H03F 2203/45594* (2013.01)

(58) Field of Classification Search
CPC ............ H03M 3/43; H03M 3/39; H03M 3/45; H03M 3/364; H03M 3/424
See application file for complete search history.

(56) References Cited

U.S. PATENT DOCUMENTS

| 6,061,009 A * | 5/2000 | Krone .................. H03M 3/364 327/337 |
| 2006/0071835 A1* | 4/2006 | Inukai .................. H03M 3/492 341/143 |
| 2006/0220935 A1 | 10/2006 | Hughes |
| 2010/0283648 A1 | 11/2010 | Niwa |

(Continued)

FOREIGN PATENT DOCUMENTS

| JP | 2013101494 A | 5/2013 |
| JP | 2016131366 A | 7/2016 |
| JP | 2017063356 A | 3/2017 |

*Primary Examiner* — Howard Williams

(57) ABSTRACT

A delta-sigma modulator and a delta-sigma converter include an analog amplifying unit to amplify an analog signal and having at least a primary feedback coefficient, a quantizer to quantize an output signal of the analog amplifying unit, a DA converter to perform DA conversion on output of the quantizer and output a feedback signal, an adder-subtractor to input into the analog amplifying unit an analog signal obtained by subtracting the feedback signal from an analog signal input therein, a reset circuit to reset the analog amplifying unit at predetermined periods, and a control circuit to control the analog amplifying unit so that the analog amplifying unit operates as an integrator with the primary feedback coefficient of 1 until a predetermined period elapses after the reset circuit resets the analog amplifying unit and as an amplifier with the primary feedback coefficient of greater than one after the predetermined period has elapsed.

12 Claims, 18 Drawing Sheets

(56) References Cited

U.S. PATENT DOCUMENTS

2011/0175762 A1    7/2011  Chae
2013/0099955 A1    4/2013  Shaeffer
2018/0069567 A1*   3/2018  Verdant ................ H03M 3/496

* cited by examiner

100

100

500

600

700

DELTA-SIGMA MODULATOR AND DELTA-SIGMA CONVERTER

The contents of the following Japanese patent application (s) are incorporated herein by reference:
No. 2017-249515 filed in JP on Dec. 26, 2017, and
No. 2018-229101 filed in JP on Dec. 6, 2018.

BACKGROUND

1. Technical Field

The present invention relates to a delta-sigma modulator and a delta-sigma converter.

2. Related Art

Conventionally, a switched capacitor integrator has been known (refer to Patent Document 1, for example). Also, a delta-sigma modulator to amplify a signal component to input by using such switched capacitor integrator has been known. Also, an incremental delta-sigma AD converter has been known, which resets electric charges accumulated in an integrating circuit at a predetermined time interval (refer to Patent Document 2, for example).

Patent Document 1: Japanese Patent Application Publication No. 2013-101494.

Patent Document 2: Japanese Patent Application Publication No. 2016-131366.

A delta-sigma converter or the like using a delta-sigma modulator and a delta-sigma modulator are required to have less power consumption as well as higher resolution.

SUMMARY

A first aspect of the present invention provides a delta-sigma modulator including an analog amplifying unit to amplify an analog signal, where the analog amplifying unit has at least a primary feedback coefficient, a quantizer to quantize an output signal of the analog amplifying unit, a DA converter to perform DA conversion on output of the quantizer and output a feedback signal to be fed back to the analog amplifying unit, an adder-subtractor to input into the analog amplifying unit an analog signal obtained by subtracting the feedback signal from an analog signal input therein, a reset circuit to reset the analog amplifying unit at predetermined periods, and a control circuit to control the analog amplifying unit so that the analog amplifying unit operates as an integrator with the primary feedback coefficient of 1 until a predetermined period of time elapses after the reset circuit resets the analog amplifying unit and as an amplifier with the primary feedback coefficient of greater than one after the predetermined period of time has elapsed.

A second aspect of the present invention provides a delta-sigma modulator including an analog amplifying unit to amplify an analog signal, where the analog amplifying unit has at least a primary feedback coefficient, a quantizer to quantize an output signal of the analog amplifying unit, a DA converter to perform DA conversion on output of the quantizer and output a feedback signal to be fed back to the analog amplifying unit, an adder-subtractor to input into the analog amplifying unit an analog signal obtained by subtracting the feedback signal from an analog signal input therein, and a control circuit to control the analog amplifying unit so that the analog amplifying unit operates as an integrator with the primary feedback coefficient of 1 until a predetermined period of time elapses and as an amplifier with the primary feedback coefficient of greater than one after the predetermined period of time has elapsed.

A third aspect of the present invention provides a delta-sigma converter including: a delta-sigma modulator of the first aspect or the second aspect; and a digital filter unit to filter a digital modulation signal output by the delta-sigma modulator.

Note that, the summary clause does not necessarily describe all necessary features of the embodiments of the present invention. The present invention may also be a sub-combination of the features described above.

DESCRIPTION OF EXEMPLARY EMBODIMENTS

Hereinafter, the present invention will be described with reference to embodiments of the invention. However, the following embodiments should not to be construed as limiting the claimed invention. Also, every combination of features described with reference to the embodiments should not to be considered essential to means provided by aspects of the invention.

Figure 1:
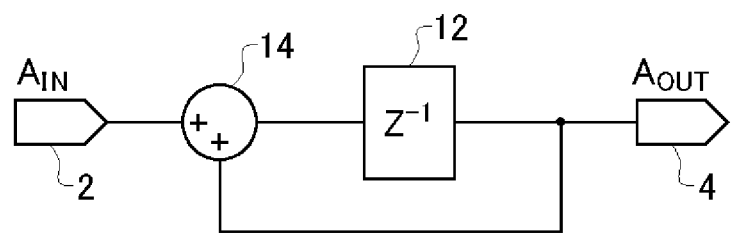
FIG. 1 illustrates an exemplary configuration of an integrator 10 in a discrete system according to the present embodiment.

FIG. 1 illustrates an exemplary configuration of an integrator 10 in a discrete system according to the present embodiment. The integrator 10 outputs an integral signal $A_{OUT}$ obtained by integrating an input analog signal $A_{IN}$. The integrator 10 includes an input terminal 2, an output terminal 4, a delay element 12, and an adder 14. The delay element 12 is provided between the input terminal 2 and the output terminal 4, and delays and outputs a signal input therein. The adder 14 inputs into the delay element 12 a signal $A_{IN}+A_{OUT}$ obtained by adding an output signal $A_{OUT}$ of the delay element 12 to the analog signal $A_{IN}$ that is input into the input terminal 2.

Accordingly, because the integrator 10 outputs a signal obtained by delaying the signal $A_{IN}+A_{OUT}$ that is input into the delay element 12, the output signal $A_{OUT}$ is expressed in the following equation.

$$A_{OUT}=z^{-1}(A_{IN}+A_{OUT})$$ [Equation 1]

According to Equation 1, an input/output characteristic is expressed in the following equation.

$$\frac{A_{OUT}}{A_{IN}} = \frac{z^{-1}}{1-z^{-1}} = \frac{1}{z-1}$$ [Equation 2]

Figure 2:
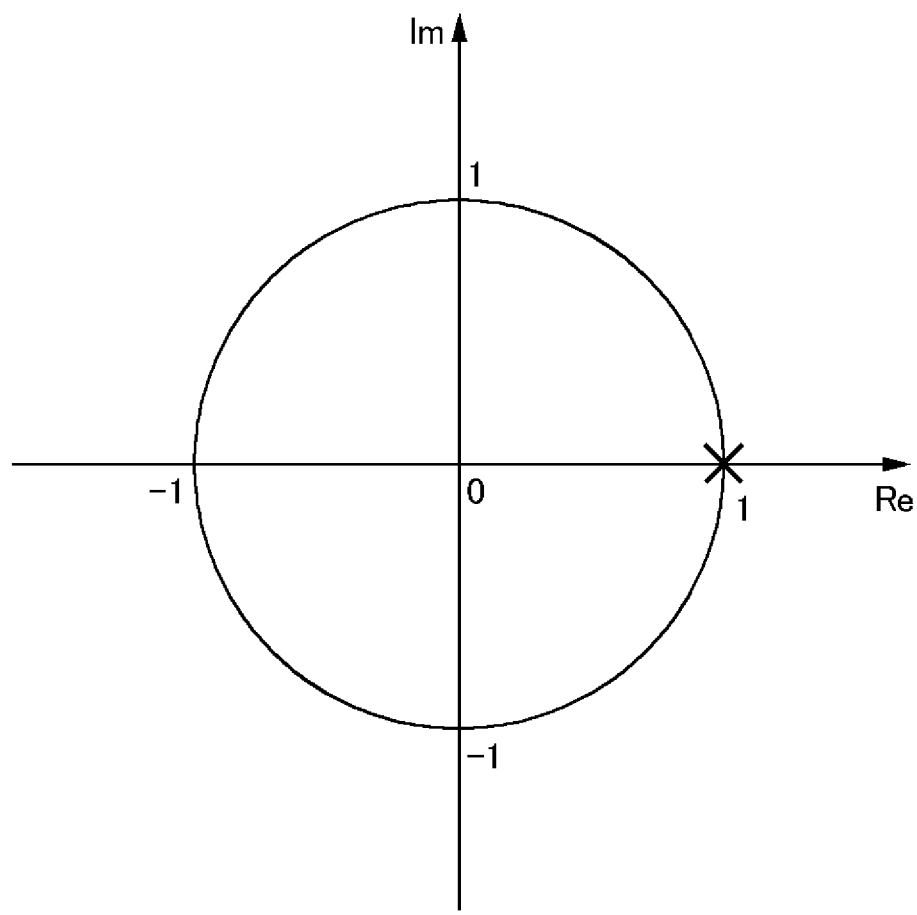
FIG. 2 is an example in which an input/output characteristic of the integrator 10 according to the present embodiment is illustrated in a Z plane.

FIG. 2 is an example in which the input/output characteristic of the integrator 10 according to the present embodiment is illustrated in a Z plane. The horizontal axis and the vertical axis of FIG. 2 indicate the real number axis and the imaginary axis respectively. As shown in FIG. 2, it can be seen that a pole emerges at one on a unit circle. Such integrator 10 can be configured as follows, using a switched capacitor or the like as a real circuit.

Figure 3:
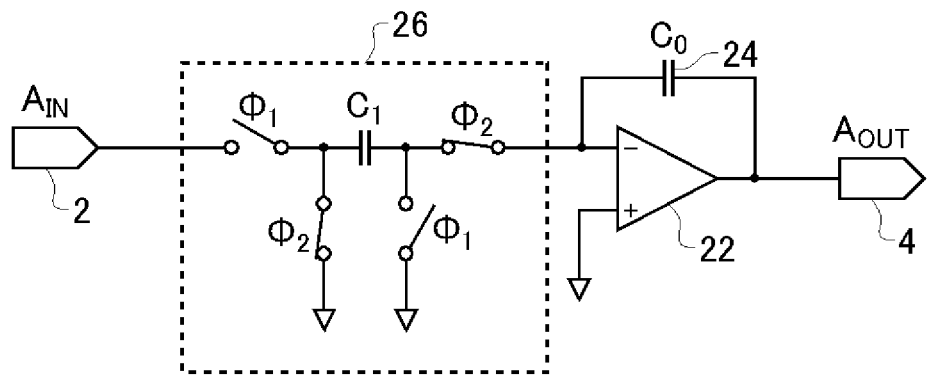
FIG. 3 illustrates an exemplary configuration of a real circuit of the integrator 10 according to the present embodiment.

FIG. 3 illustrates an exemplary configuration of a real circuit of the integrator 10 according to the present embodiment. The integrator 10 includes an input terminal 2, an output terminal 4, an amplifier 22, a feedback capacitor 24, and a switched capacitor circuit 26. The amplifier 22 and the switched capacitor circuit 26 are connected in series between the input terminal 2 and the output terminal 4. An output terminal of the switched capacitor circuit 26 is connected to one of the input terminals of the amplifier 22, and reference potential is connected to the other input terminal thereof. The reference potential may be a predetermined potential, for example, 0 V (the ground potential). An output terminal of the amplifier 22 is connected to the output terminal 4 of the integrator 10.

The feedback capacitor 24 is connected between one of the input terminals and the output terminal of the amplifier 22. The feedback capacitor 24 accumulates signals that are input into one of the input terminals of the amplifier 22. The switched capacitor circuit 26 is provided between the input terminal 2 and one of the terminals of the amplifier 22, and repeatedly charges the analog signal input into the integrator 10 and discharges of the analog signals to the amplifier 22.

The switched capacitor circuit 26 has a first capacitor $C_1$. For example, the switched capacitor circuit 26 connects one of the terminals of the first capacitor $C_1$ to the input terminal 2 of the integrator 10, and connects the other terminal of the first capacitor $C_1$ to reference potential during a period φ1 to charge analog signals input from the input terminal 2. In this case, the switched capacitor circuit 26 connects the one of the terminals of the first capacitor $C_1$ to the reference potential, and connects the other terminal to one of the input terminals of the amplifier 22 during a period φ2 to discharge the charged electric charges. The switched capacitor circuit 26 repeats the period φ1 and the period φ2, i.e., repeats charge/discharge of the first capacitor $C_1$.

Figure 4:
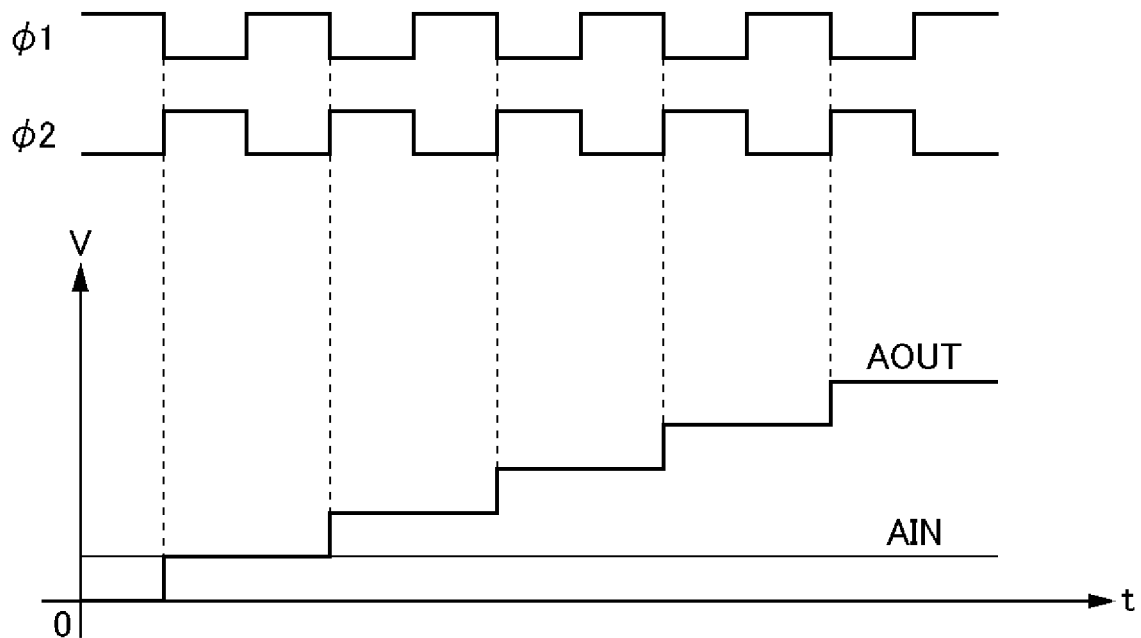
FIG. 4 illustrates one example of an operation characteristic of the integrator 10 illustrated in FIG. 3.

FIG. 4 illustrates one example of an operation characteristic of the integrator 10 illustrated in FIG. 3. The horizontal axis and the vertical axis of FIG. 4 indicate the time and the voltage respectively. FIG. 4 illustrates examples of an output signal $A_{OUT}$ input from the output terminal 4 of the integrator 10, and timing signals of the period φ1 and the period φ2. In this case, the timing signals of the period φ1 and the period φ2 may be signals synchronized with a substantially constant clock cycle. That is, in the period φ1 and the period φ2, on and off are switched over at a predetermined cycle. Also, FIG. 4 illustrates an example in which an analog signal input into the integrator 10 is 0 V until time zero, and substantially constant potential $A_{IN}$ from the time zero onward.

The output signal $A_{OUT}$ of such integrator 10 changes as shown in the following equation depending on n clock signals (i.e., charge/discharge n times). That is, the integrator 10 operates so as to amplify the analog signal $A_{IN}$ that is input by n times. Here, n corresponds to the number of clocks to input. A delta-sigma modulator is known to use such integrator 10.

$$A_{OUT} = \sum_{i=1}^{n} A_{IN} = nA_{IN}$$ [Equation 3]

Figure 5:
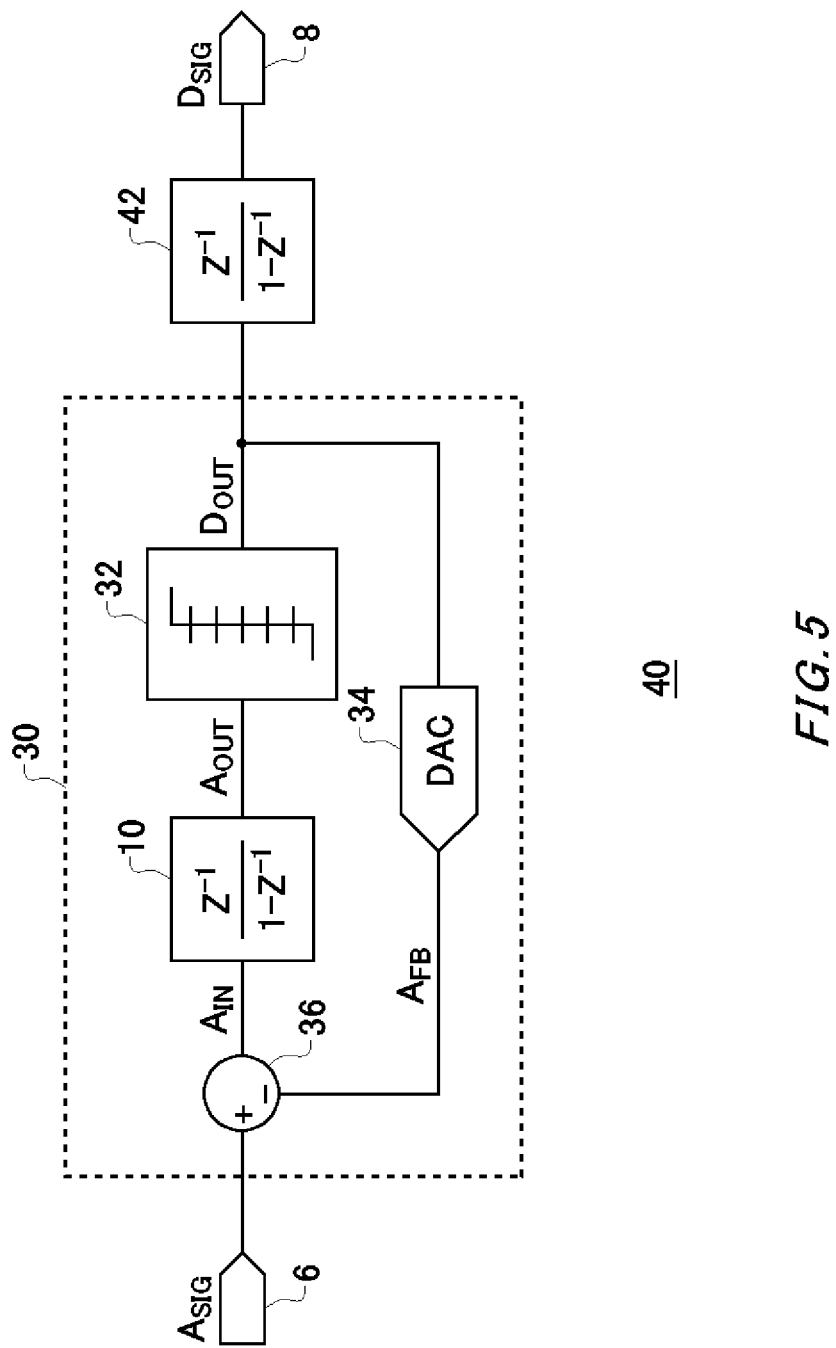
FIG. 5 illustrates an exemplary configuration of a delta-sigma converter 40 using the integrator 10 illustrated in FIG. 3.

FIG. 5 illustrates an exemplary configuration of a delta-sigma converter 40 using the integrator 10 illustrated in FIG. 3. The delta-sigma converter 40 includes an input terminal 6, an output terminal 8, a delta-sigma modulator 30, and a digital filter unit 42. The delta-sigma modulator 30 and the digital filter unit 42 are connected in series between the input terminal 6 and the output terminal 8.

FIG. 5 illustrates an example in which the delta-sigma modulator 30 operates as a primary modulator having one integrator 10. The delta-sigma modulator 30 has the integrator 10, a quantizer 32, a DA converter 34, and an adder-subtractor 36. The quantizer 32 outputs a digital signal $D_{OUT}$ obtained by quantizing an output signal $A_{OUT}$ of the integrator 10. The DA converter 34 performs DA conversion on the output $D_{OUT}$ of the quantizer 32 and outputs a feedback signal $A_{FB}$ to feedback to the integrator 10. The adder-subtractor 36 inputs into the integrator 10 an analog signal $A_{IN}$ obtained by subtracting the feedback signal $A_{FB}$ from an analog signal $A_{SIG}$ that is input into the delta-sigma modulator 30.

The integrator 10 of the delta-sigma modulator 30, which operates as the primary modulator, outputs a value obtained by amplifying the analog signal $A_{SIG}$ and the feedback signal $A_{FB}$ that are input therein by n times after n clock signals are input as described in FIG. 4. That is, the analog signal $A_{IN}$ that is input into the integrator 10 is expressed with difference between the analog signal $A_{SIG}$ and the feedback signal $A_{FB}$ that are input into the delta-sigma modulator 30, as shown in the following equation. Also, according to Equation 2, the output signal $A_{OUT}$ of the integrator 10 is expressed in the following equation.

$$A_{IN} = A_{SIG} - A_{FB} \quad \text{[Equation 4]}$$

$$A_{OUT} = \frac{z^{-1}}{1-z^{-1}} A_{IN}$$

If the DA converter 34 operates in an ideal manner, the output $D_{OUT}$ of the quantizer 32 and the feedback signal $A_{FB}$ can have substantially the same value. Thereby, Equation 4 is expressed in the following equation.

$$A_{OUT} = \frac{z^{-1}}{1-z^{-1}} (A_{SIG} - D_{OUT}) \quad \text{[Equation 5]}$$

Here, if an initial value of the output signal $A_{OUT}$ of the integrator 10 is zero, and the analog signal $A_{SIG}$ that is input into the delta-sigma modulator 30 is a substantially constant value, and assume that an i-th output of the quantizer 32 is $D_{OUT}(i)$, the output signal $A_{OUT}$ is expressed in the following equation. Note that, n represents the number of clocks to input.

$$A_{OUT} = nA_{SIG} - \sum_{i=1}^{n} (D_{OUT}(i)) \quad \text{[Equation 6]}$$

The following equation is obtained by modifying Equation 6.

$$A_{SIG} = \frac{\sum_{i=1}^{n} (D_{OUT}(i))}{n} + \frac{A_{OUT}}{n} \quad \text{[Equation 7]}$$

According to Equation 7, it can be seen that the analog signal $A_{SIG}$ that is input into the delta-sigma modulator 30 can be expressed using the output $D_{OUT}$ of the quantizer 32. That is, by calculating as shown in the first term on the right side of Equation 7 using the digital output $D_{OUT}$ of the delta-sigma modulator 30, a digital signal $D_{SIG}$ can be calculated, which is obtained by digitally converting the analog signal $A_{SIG}$.

The digital filter unit 42 performs such operation, i.e., a digital operation equivalent to operation of the integrator 10, which is illustrated in the following equation.

$$\frac{\sum_{i=1}^{n} (D_{OUT}(i))}{n} \quad \text{[Equation 8]}$$

Accordingly, because the digital filter unit 42 can output the digital signal $D_{SIG}$ obtained from digitally converting the analog signal $A_{SIG}$, it can be seen that the delta-sigma converter 40 illustrated in FIG. 5 can perform AD converting operation. Note that, the output $D_{SIG}$ of the delta-sigma converter 40 is substantially equal to the value obtained from Equation 8. Accordingly, by comparing Equation 7 and Equation 8, a quantization error $E_{MOD1}$ of the AD conversion is expressed in the following equation.

$$E_{MOD1} = \frac{A_{OUT}}{n} \quad \text{[Equation 9]}$$

Here, if a feedback loop of the delta-sigma modulator 30 is stabilized, it is possible to suppress the output signal $A_{OUT}$ of the integrator 10 to be a value equal to or less than a substantially constant voltage value V. If it is stabilized accordingly, the quantization error $E_{MOD1}$ of the delta-sigma modulator 30 is expressed in the following equation.

$$E_{MOD1} < \frac{V}{n} \quad \text{[Equation 10]}$$

According to Equation 10, it can be seen that the delta-sigma converter 40 can reduce the quantization error to 1/n by using the primary delta-sigma modulator 30 to perform integral operation n times with the initial value of the output of the integrator 10 being set to 0. That is, the delta-sigma converter 40 can improve resolution of the AD conversion by n times. Note that, in order to make the initial value of the output of the integrator 10 be zero, the delta-sigma converter 40 may reset the integrator 10 and the digital filter unit 42 at a predetermined cycle. A delta-sigma converter 40 to perform such reset operation is known as an incremental delta-sigma converter.

Such delta-sigma converter 40 can further improve resolution by increasing the number of integrators 10 of a delta-sigma modulator 30. That is, in FIG. 5, a plurality of integrators 10 may be connected in series between the adder-subtractor 36 and the quantizer 32. For example, a delta-sigma modulator 30 is described below in an example in which it is provided with three integrators 10 between the adder-subtractor 36 and the quantizer 32.

Among the three integrators 10, an output signal $A_{OUT3}$ of a final stage integrator 10 is expressed in the following equation.

$$A_{OUT3} = \left(\frac{z^{-1}}{1-z^{-1}}\right)^3 (A_{SIG} - D_{OUT}) \quad \text{[Equation 11]}$$

Here, if initial values of output signals of the three integrators 10 are zero, and an analog signal $A_{SIG}$ that is input into the delta-sigma modulator 30 is a substantially constant value, and assume that an i-th output of the quantizer 32 is $D_{OUT}(i)$, the output signal $A_{OUT3}$ is expressed in the following equation.

$$A_{OUT3} = \frac{n(n-1)(n-2)}{3!} A_{SIG} - \sum_{i=1}^{n-2} \sum_{j=1}^{i} \sum_{k=1}^{j} (D_{OUT}(k)) \quad \text{[Equation 12]}$$

The following equation is obtained by modifying Equation 12.

$$A_{SIG} = \frac{\sum_{i=1}^{n-2}\sum_{j=1}^{i}\sum_{k=1}^{j}(D_{OUT}(k))}{\frac{n(n-1)(n-2)}{3!}} + \frac{A_{OUT3}}{\frac{n(n-1)(n-2)}{3!}} \quad \text{[Equation 13]}$$

According to Equation 13, the analog signal $A_{SIG}$ that is input into the delta-sigma modulator 30 can be expressed using the output $D_{OUT}$ of the quantizer 32. Thus, the digital signal $D_{SIG}$ can be calculated, which is obtained by digitally converting the analog signal $A_{SIG}$. A quantization error $E_{MOD3}$ of an AD conversion in a case of using such third modulator is expressed in the following equation that is substantially the same as the second term of Equation 13.

$$E_{MOD3} = \frac{A_{OUT3}}{\frac{n(n-1)(n-2)}{3!}} \quad \text{[Equation 14]}$$

In this case also, by stabilizing a feedback loop of the delta-sigma modulator 30, it is possible to suppress the output signal $A_{OUT3}$ of the final stage integrator 10 to be a value equal to or less than a substantially constant voltage value V. That is, the quantization error $E_{MOD3}$ of the third delta-sigma modulator 30 is expressed in the following equation.

$$E_{MOD3} < \frac{V}{\frac{n(n-1)(n-2)}{3!}} \quad \text{[Equation 15]}$$

According to Equation 15, it is possible for the delta-sigma converter 40 to reduce the quantization error to $3!/\{n \cdot (n-1) \cdot (n-2)\}$ by using the third delta-sigma modulator 30 to perform integral operation n times with the initial value of the output of the integrator 10 being set to zero. That is, the delta-sigma converter 40 can improve the resolution of AD conversion by $\{n \cdot (n-1) \cdot (n-2)\}/3!\}$ times. Accordingly, if using L-th order delta-sigma modulator for an incremental delta-sigma converter, resolution $R_L$ is known to be expressed in the following equation. Note that, one bit DA converter is used for the DA converter 34.

$$R_L = \frac{n(n-1)\ldots(n-L+1)}{L!} \quad \text{[Equation 16]}$$

If a delta-sigma converter or the like with the primary modulator is used, as shown in Equation 10, resolution of AD conversion can be improved by n times by performing integral operation n times. For example, by performing integral operation $n=2^{16}$ times, resolution of 16 bit can be obtained. However, if such high resolution is obtained, and assuming that a clock frequency is f[Hz], conversion speed is approximately $f/2^{16}$ [Hz]. Thus, it can no longer be used as an AD converter having high speed operation.

Therefore, by using a delta-sigma converter or the like using L-th order modulator (L>1), it is possible to realize an AD converter having faster conversion speed performance and higher resolution. However, if higher order L-th order modulator is used, the number L of integrators 10 is needed. Thus, power consumption will be increased and cost will rise. Therefore, the delta-sigma modulator and the delta-sigma converter according to the present embodiment prevent the increase in power consumption and the rise in cost, while realizing an AD converter having faster conversion speed performance and higher resolution.

Figure 6:
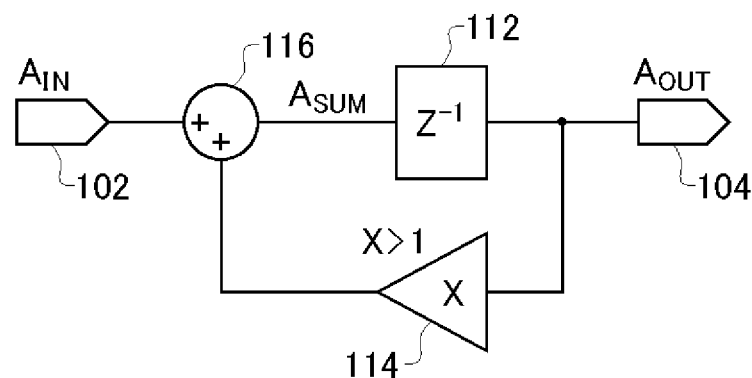
FIG. 6 illustrates an exemplary configuration of an analog amplifying unit 100 in a discrete system according to the present embodiment.

FIG. 6 illustrates an exemplary configuration of an analog amplifying unit 100 in a discrete system according to the present embodiment. The delta-sigma modulator and the delta-sigma converter according to the present embodiment realize an AD converter having high speed performance and high resolution by using such analog amplifying unit 100 in place of an integrator 10. The analog amplifying unit 100 may have a configuration in which an amplifier is provided in a feedback loop of the integrator 10 illustrated in FIG. 1. That is, the analog amplifying unit 100 includes an input terminal 102, an output terminal 104, a delay element 112, an amplifier 114, and an adder 116.

The delay element 112 is provided between the input terminal 102 and the output terminal 104, and delays and outputs a signal input therein. The amplifier 114 amplifies output of the delay element 112 and supplies it to the adder 116. The amplifier 114 amplifies an output $A_{OUT}$ of the delay element 112 at a multiplying factor x being greater than one. The adder 116 inputs into the delay element 112 an signal $A_{IN}+x \cdot A_{OUT}$ obtained by adding an output signal $x \cdot A_{OUT}$ of the amplifier 114 to an analog signal $A_{IN}$ that is input into the input terminal 102.

Accordingly, because the analog amplifying unit 100 outputs a signal obtained by delaying the signal $A_{IN}+x \cdot A_{OUT}$ that is input into the delay element 112, the output signal $A_{OUT}$ is expressed in the following equation.

$$A_{OUT} = z^{-1}(A_{IN} + xA_{OUT}) \quad \text{[Equation 17]}$$

According to Equation 17, an input/output characteristic is expressed in the following equation.

$$\frac{A_{OUT}}{A_{IN}} = \frac{z^{-1}}{1 - xz^{-1}} = \frac{1}{z - x} \quad \text{[Equation 18]}$$

Figure 7:
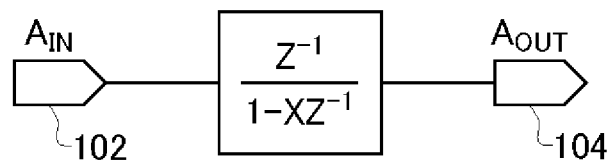
FIG. 7 illustrates an exemplary configuration equivalent to the analog amplifying unit 100 illustrated in FIG. 6.
Figure 8:
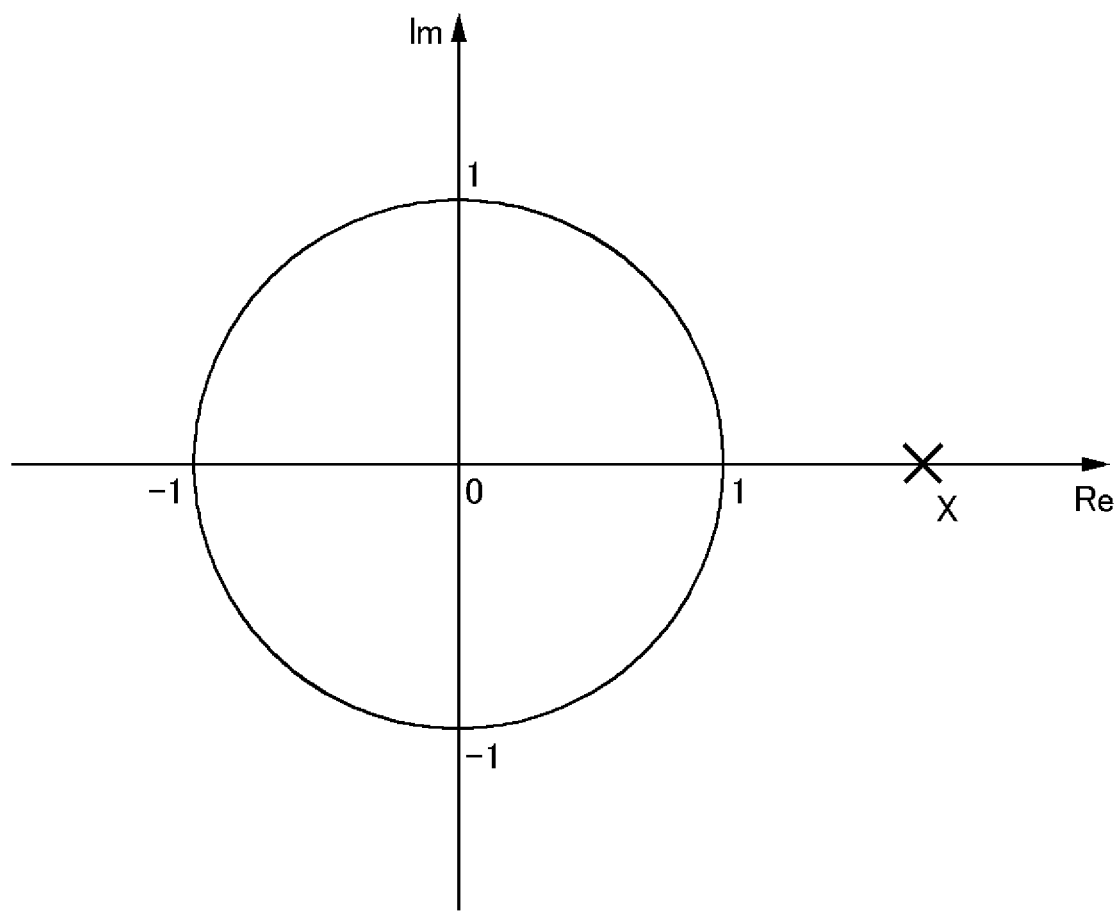
FIG. 8 is an example in which an input/output characteristic of the analog amplifying unit 100 according to the present embodiment is illustrated in a Z plane.

FIG. 7 illustrates an exemplary configuration equivalent to the analog amplifying unit 100 illustrated in FIG. 6. Also, FIG. 8 is an example in which an input/output characteristic of such analog amplifying unit 100 is illustrated in a Z plane. The horizontal axis and the vertical axis of FIG. 8 indicate the real number axis and the imaginary axis respectively. As shown in FIG. 8, it can be seen that a pole emerges outside a unit circle. Note that, although FIG. 8 is described using the Z plane as a system of a discrete system, it may also be represented using an S plane as a system of a continuous system. In this case, a pole of an analog amplifying unit 100 is arranged in a right half plane of the S plane. Such analog amplifying unit 100 can be configured as follows, using a switched capacitor or the like as a real circuit.

Figure 9:
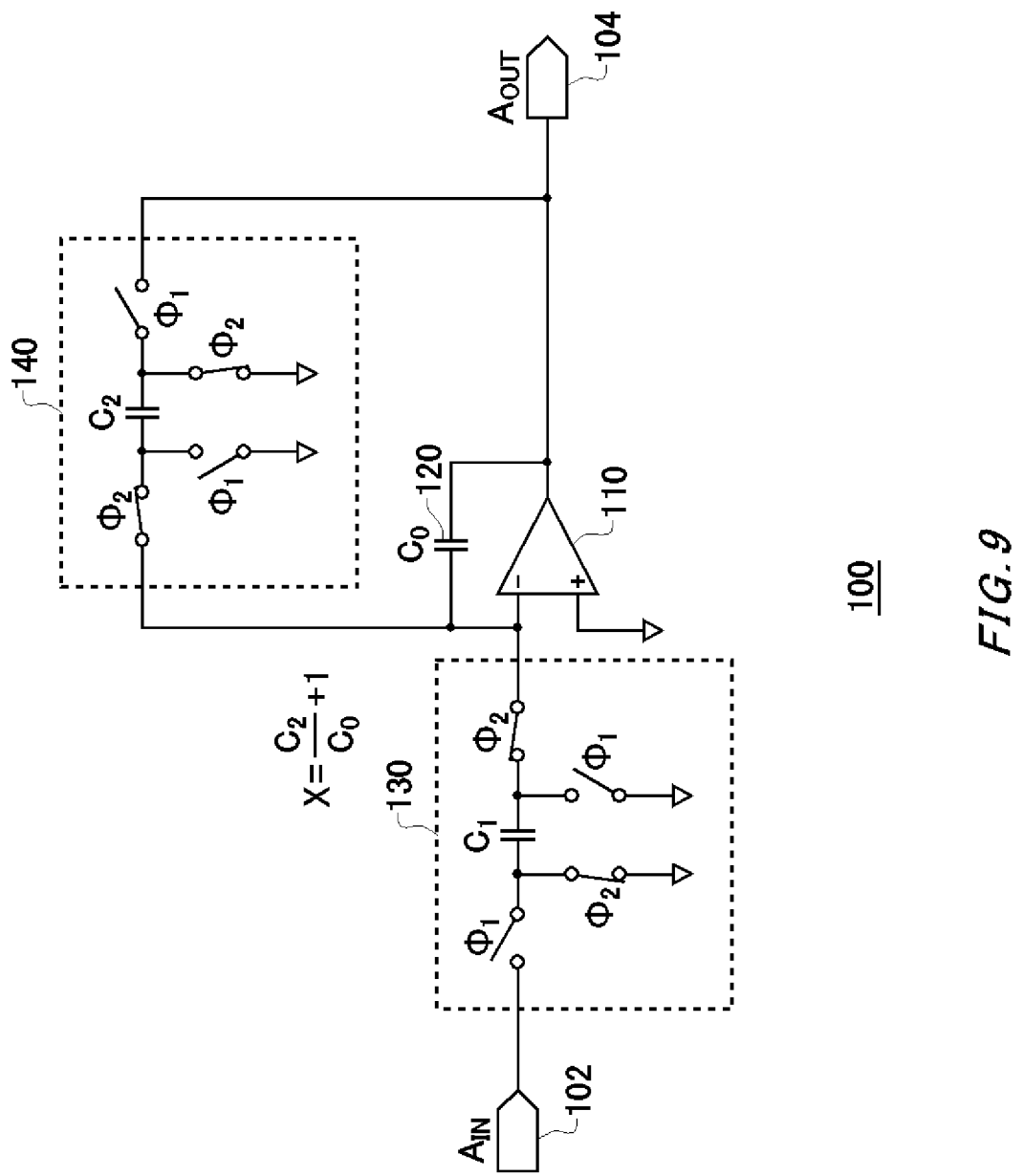
FIG. 9 illustrates an exemplary configuration of a real circuit of the analog amplifying unit 100 according to the present embodiment.

FIG. 9 illustrates an exemplary configuration of a real circuit of the analog amplifying unit 100 according to the present embodiment. The analog amplifying unit 100 includes an input terminal 102, an output terminal 104, an analog amplifier 110, a feedback capacitor 120, a first switched capacitor circuit 130, and a second switched capacitor circuit 140.

The analog amplifier 110 is provided between the input terminal 102 and the output terminal 104. The analog amplifier 110 may be an operational amplifier or the like. One of the input terminals of the analog amplifier 110 receives a signal from the input terminal 102 via the first switched capacitor circuit 130. The other input terminal of the analog amplifier 110 is connected to reference potential. The reference potential may be a predetermined potential, for example, 0 V (the ground potential). An output terminal of the analog amplifier 110 is connected to the output terminal 104.

The feedback capacitor 120 is provided between one of the input terminals and an output terminal of the analog amplifier 110 and forms a part of a feedback circuit. Here, the capacitance of the feedback capacitor 120 is $C_0$.

The first switched capacitor circuit 130 is provided between the input terminal 102 and the analog amplifier 110. Output of the first switched capacitor circuit 130 is connected to one of the input terminals of the analog amplifier 110. That is, the first switched capacitor circuit 130 and the analog amplifier 110 are connected in series between the input terminal 102 and the output terminal 104. The first switched capacitor circuit 130 includes a first capacitor $C_1$ to charge/discharge a signal input therein.

For example, the first switched capacitor circuit 130 connects one of the terminals of the first capacitor $C_1$ to the input terminal 102 of the analog amplifying unit 100, and connects the other terminal to the reference potential during a period $\varphi 1$ to charge an analog signal input from the input terminal 102. In this case, the first switched capacitor circuit 130 connects the one of the terminals of the first capacitor $C_1$ to the reference potential, and connects the other terminal to one of the input terminals of the analog amplifier 110 during a period $\varphi 2$ to discharge the charged electric charges. The first switched capacitor circuit 130 repeats the period $\varphi 1$ and the period $\varphi 2$, i.e., repeats charge/discharge of the first capacitor $C_1$.

The second switched capacitor circuit 140 is provided between one of the input terminals and an output terminal of the analog amplifier 110. That is, the second switched capacitor circuit 140 and the feedback capacitor 120 are provided in parallel as a feedback circuit of the analog amplifier 110. The second switched capacitor circuit 140 includes a second capacitor $C_2$ to charge/discharge a signal input therein.

For example, the second switched capacitor circuit 140 connects one of the terminals of the second capacitor $C_2$ to the output terminal 104 of the analog amplifying unit 100, and connects the other terminal to reference potential during a period $\varphi 1$ to charge a signal input therein. In this case, the second switched capacitor circuit 140 connects one of the terminals of the second capacitor $C_2$ to the reference potential, and connects the other terminal to one of the input terminals of the analog amplifier 110 during a period $\varphi 2$ to discharge the charged electric charges. The second switched capacitor circuit 140 repeats the period $\varphi 1$ and the period $\varphi 2$, i.e., repeats charge/discharge of the second capacitor $C_2$.

An amplification factor x of such analog amplifying unit 100 is defined as shown in the following equation based on a ratio of the second capacitor $C_2$ and the feedback capacitor 120.

$$x = \frac{C_2}{C_0} + 1 \quad \text{[Equation 19]}$$

That is, in the case of the integrator 10 of FIG. 3, integral operation is performed by holding electric charges in the feedback capacitor 24. On the other hand, because the analog amplifying unit 100 of FIG. 9 adds an electric charge corresponding to a capacitance ratio of $C_2/C_0$ to an electric charge of the feedback capacitor 120 and supplies it to the one input of the analog amplifier 110, an operation of an amplification factor exceeding one is realized.

Figure 10:
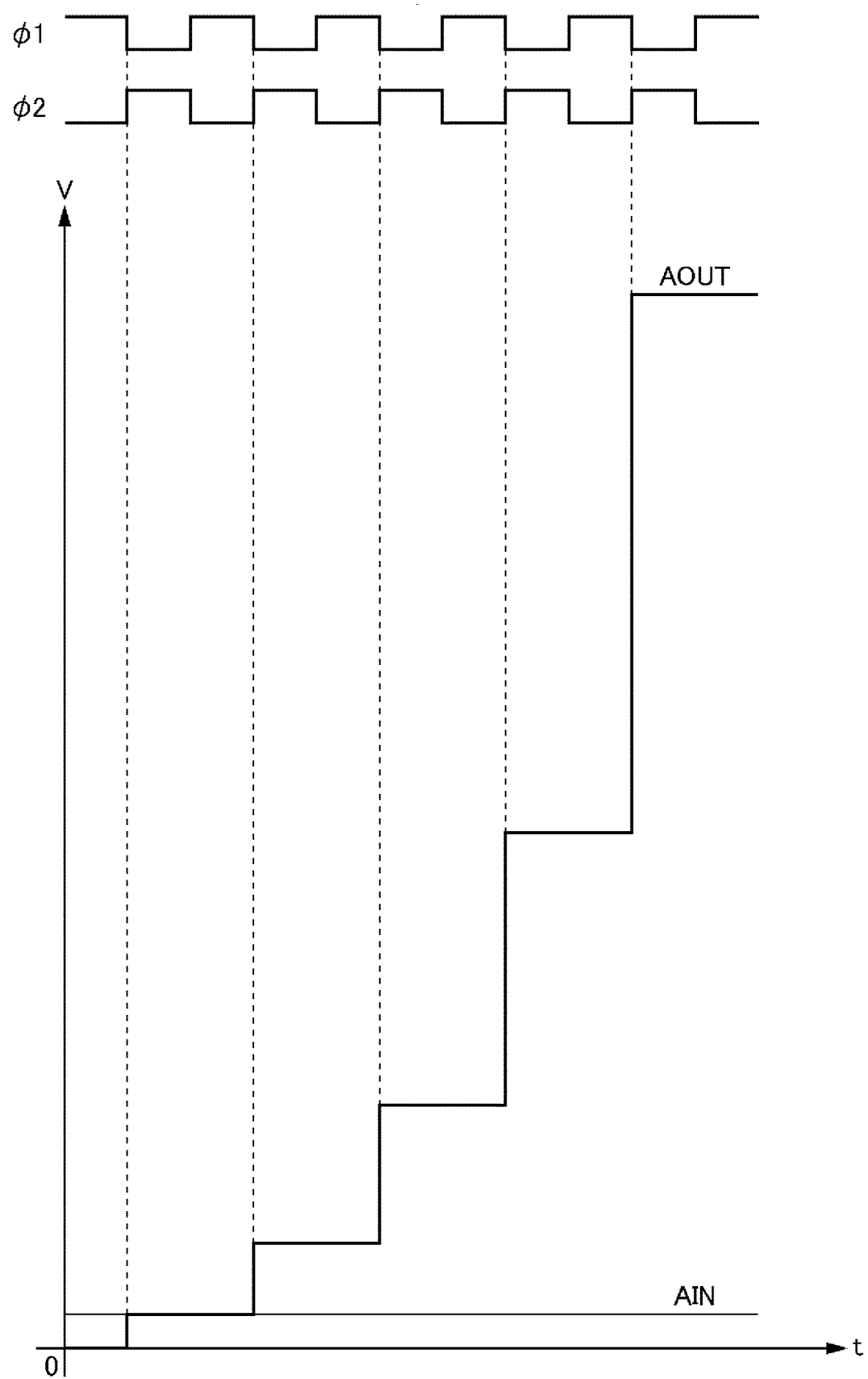
FIG. 10 illustrates one example of an operation characteristic of the analog amplifying unit 100 according to the present embodiment.

FIG. 10 illustrates one example of an operation characteristic of the analog amplifying unit 100 according to the present embodiment. The horizontal axis and the vertical axis of FIG. 10 indicate the time and the voltage respectively. FIG. 10 illustrates examples of an output signal $A_{OUT}$ input from the output terminal 104 of the analog amplifying unit 100, and timing signals of period $\varphi 1$ and period $\varphi 2$. In this case, the timing signals of the period $\varphi 1$ and the period $\varphi 2$ may be signals synchronized with a substantially constant clock cycle. That is, in the period $\varphi 1$ and the period $\varphi 2$, on and off are switched over at a predetermined cycle. Also, FIG. 10 illustrates an example in which an analog signal input into the analog amplifying unit 100 is 0 V until time zero, and is substantially constant potential $A_{IN}$ from the time zero onward. Also, FIG. 10 illustrates an example of an operation characteristic in a case in which $C_2=C_0$, i.e., an amplification factor x of the analog amplifying unit 100 is two.

An output signal $A_{OUT}$ of such analog amplifying unit 100 changes as shown in the following equation (where x>1) depending on n clock signals (i.e., charge/discharge n times).

$$A_{OUT} = \frac{\sum_{i=1}^{n}(x^{n-i}A_{IN})}{x-1} \quad \text{[Equation 20]}$$

Note that, because an analog signal input into the analog amplifying unit 100 from time zero is a substantially constant potential $A_{IN}$, Equation 20 is expressed in the following equation. That is, it can be seen that the output signal $A_{OUT}$ of the analog amplifying unit 100 exponentially increases relative to an increase of n. A delta-sigma modulator using such analog amplifying unit 100 is described next.

$$A_{OUT} = \frac{x^n - 1}{x - 1} A_{IN} \quad \text{[Equation 21]}$$

Figure 11:
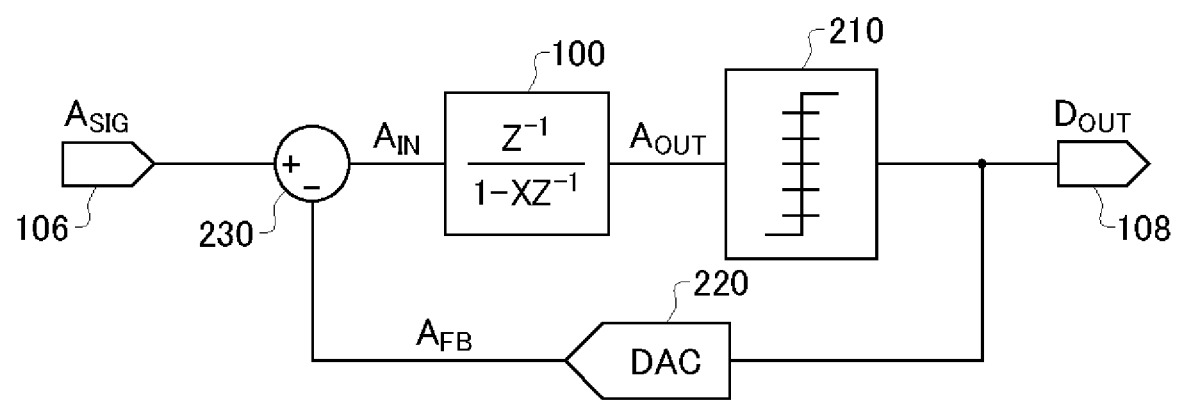
FIG. 11 illustrates an exemplary configuration of a delta-sigma modulator 200 according to the present embodiment.

FIG. 11 illustrates an exemplary configuration of a delta-sigma modulator 200 according to the present embodiment. The delta-sigma modulator 200 uses the analog amplifying unit 100 shown in FIG. 9. That is, the delta-sigma modulator 200 includes an input terminal 106, an output terminal 108, an analog amplifying unit 100, a quantizer 210, a DA converter 220, and an adder-subtractor 230.

As described in FIG. 9 and FIG. 10, the analog amplifying unit 100 amplifies an analog signal input therein. The quantizer 210 outputs a digital signal $D_{OUT}$ obtained by quantizing an output signal $A_{OUT}$ of the analog amplifying unit 100. The analog amplifying unit 100 has at least a primary feedback coefficient, and the feedback coefficient is greater than one. For example, if a feedback circuit is in an ideal form and loss can be substantially ignored, an amplification factor of an analog amplifying unit 100 may have a value greater than one. The amplification factor may be substantially equal to a feedback coefficient.

The quantizer 210 may quantize an output signal $A_{OUT}$ of the analog amplifying unit 100 depending on a clock signal or the like supplied from outside. The quantizer 210 may function as a one bit quantizer and quantize to output a binary digital signal. Instead of this, the quantizer 210 may also function as a multi-bit quantizer and quantize to output a multi-value digital signal.

The DA converter 220 performs DA conversion on the output $D_{OUT}$ of the quantizer 210 and outputs a feedback signal $A_{FB}$ to feedback to the analog amplifying unit 100. The DA converter 220 may convert the digital signal $D_{OUT}$ into the analog signal $A_{FB}$ in synchronization with a clock signal or the like. The adder-subtractor 230 input into the analog amplifying unit 100 an analog signal obtained by subtracting the feedback signal from the analog signal.

The analog signal $A_{IN}$ input into the analog amplifying unit 100 described above is expressed with difference between the analog signal $A_{SIG}$ and the feedback signal $A_{FB}$ that are input into the delta-sigma modulator 200, as shown in the following equation. Also, according to Equation 18, the output signal $A_{OUT}$ of the analog amplifying unit 100 is expressed in the following equation.

$$A_{IN} = A_{SIG} - A_{FB} \qquad \text{[Equation 22]}$$

$$A_{OUT} = \frac{z^{-1}}{1 - xz^{-1}} A_{IN}$$

If the DA converter 220 operates in an ideal manner, the output $D_{OUT}$ of the quantizer 210 and the feedback signal $A_{FB}$ can have substantially the same value. Thereby, Equation 22 is expressed in the following equation.

$$A_{OUT} = \frac{z^{-1}}{1 - xz^{-1}} (A_{SIG} - D_{OUT}) \qquad \text{[Equation 23]}$$

Here, if an initial value of the output signal $A_{OUT}$ of the analog amplifying unit 100 is zero, and the analog signal $A_{SIG}$ that is input into the delta-sigma modulator 200 is a substantially constant value, and assume that an i-th output of the quantizer 210 is $D_{OUT}(i)$, the output signal $A_{OUT}$ is expressed in the following equation. Note that, n represents the number of clocks to input. Here, $x>1$.

$$A_{OUT} = \frac{x^n - 1}{x - 1} A_{SIG} - \sum_{i=1}^{n} (x^{n-i} D_{OUT}(i)) \qquad \text{[Equation 24]}$$

The following equation is obtained by modifying Equation 24.

$$A_{SIG} = \frac{\sum_{i=1}^{n} (n^{n-i} D_{OUT}(i))}{\frac{x^n - 1}{x - 1}} + \frac{A_{OUT}}{\frac{x^n - 1}{x - 1}} \qquad \text{[Equation 25]}$$

As described above, it can be seen that the analog signal $A_{SIG}$ that is input into the delta-sigma modulator 200 can be expressed using the output $D_{OUT}$ of the quantizer 210. Accordingly, by calculating as shown in the first term on the right side of Equation 25 using the digital output $D_{OUT}$ of the delta-sigma modulator 200, a digital signal $D_{SIG}$ can be calculated, which is obtained by digitally converting the analog signal $A_{SIG}$.

Figure 12:
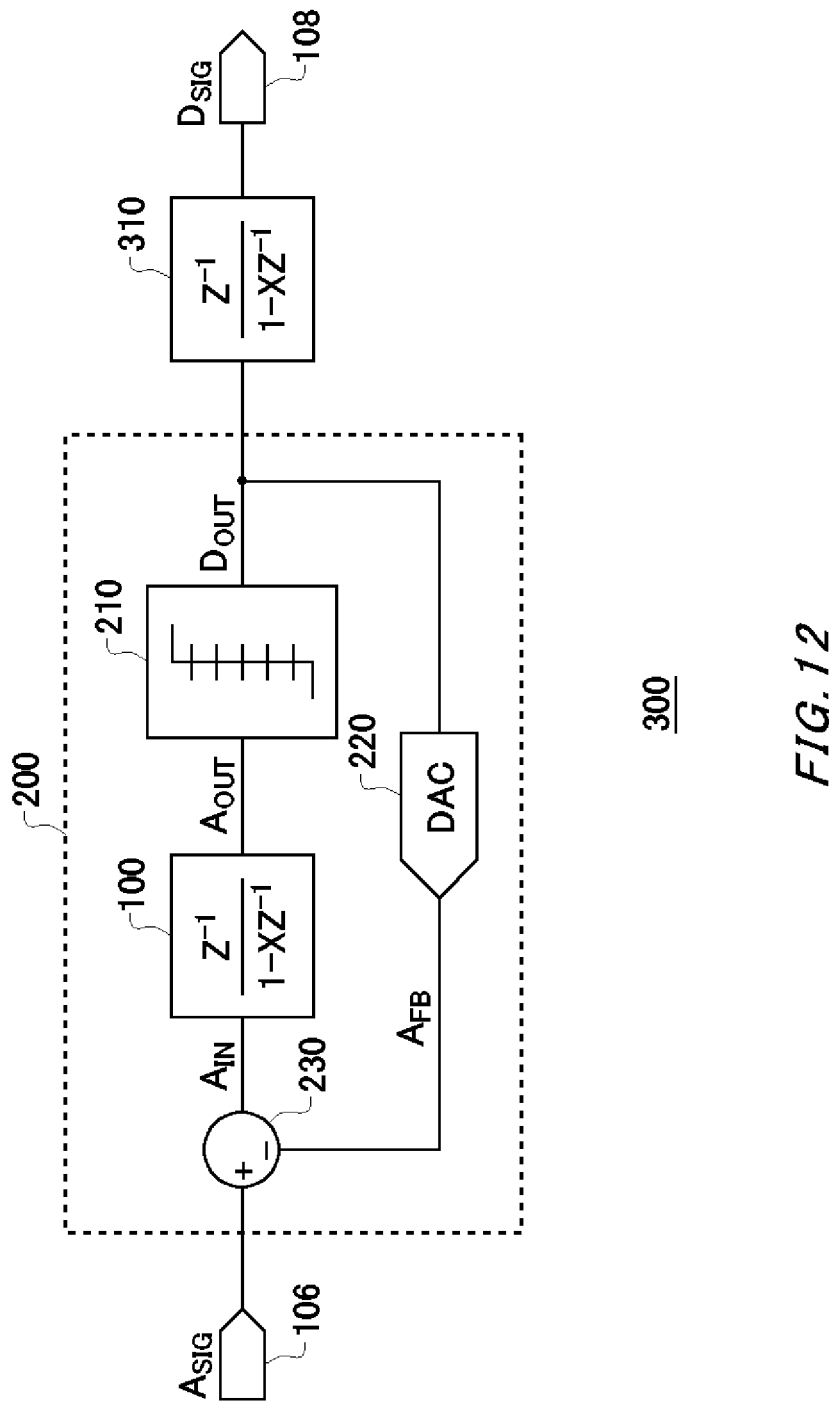
FIG. 12 illustrates an exemplary configuration of a delta-sigma converter 300 according to the present embodiment.

FIG. 12 illustrates an exemplary configuration of a delta-sigma converter 300 according to the present embodiment. The delta-sigma converter 300 includes a delta-sigma modulator 200 that is described in FIG. 11, and a digital filter unit 310. Because the delta-sigma modulator 200 has been described in FIG. 11, explanation thereof is omitted herein.

A digital filter unit 310 filters a digital modulation signal output by the delta-sigma modulator 200. The digital filter unit 310 performs a digital operation equivalent to amplifying operation of the analog amplifying unit 100. That is, the digital filter unit 310 performs a digital operation substantially equivalent to operation of the delta-sigma modulator 200, which is illustrated in the following equation.

$$\frac{\sum_{i=1}^{n} (x^{n-i} D_{OUT}(i))}{\frac{x^n - 1}{x - 1}} \qquad \text{[Equation 26]}$$

Accordingly, because the digital filter unit 310 can output the digital signal $D_{SIG}$ obtained from digitally converting the analog signal $A_{SIG}$, it can be seen that the delta-sigma converter 300 illustrated in FIG. 12 can perform AD converting operation. Note that, a quantization error $E_1$ of the AD conversion of the delta-sigma converter 300 is expressed in the following equation.

$$E_1 = \frac{A_{OUT}}{\frac{x^n - 1}{x - 1}} \qquad \text{[Equation 27]}$$

Here, if a feedback loop of the delta-sigma modulator 200 is stabilized, it is possible to suppress the output signal $A_{OUT}$ of the analog amplifying unit 100 to be a value equal to or less than a substantially constant voltage value V. If it is stabilized accordingly, the quantization error $E_1$ of the delta-sigma modulator 200 is expressed in the following equation.

$$E_1 < \frac{V}{\frac{x^n - 1}{x - 1}} \qquad \text{[Equation 28]}$$

As described above, the delta-sigma modulator 200 according to the present embodiment can further reduces a quantization error by using the analog amplifying unit 100, compared with a delta-sigma modulator 30 using an integrator 10. For example, if n=10, according to Equation 10, a delta-sigma modulator 30 using an integrator 10 has a quantization error $E_{MOD1}$ of less than V/10. Also, according to Equation 15, a quantization error $E_{MOD3}$ of a third delta-sigma modulator 30 is less than V/120. On the other hand, according to Equation 28, a quantization error $E_1$ of a delta-sigma modulator 200 using an analog amplifying unit 100 is less than V/1023 assuming that x=2.

That is, the delta-sigma modulator 200 according to the present embodiment can obtain resolution of 102.3 times a primary delta-sigma modulator 30 and 8.525 times a third delta-sigma modulator 30. Also, the analog amplifying unit 100 is not constituted by a plurality of delay elements 112 connected in series. Thereby, high resolution can be realized without reducing conversion speed like the case of an n-th delta-sigma modulator 30 while preventing the increase in power consumption caused by a multi-stage analog amplifier 110.

The example of FIG. 11 is described as an exemplary configuration of the delta-sigma modulator 200 according to the present embodiment described above. However, it shall not be construed as a limiting example. Various circuits may be added to the delta-sigma modulator 200. For example, an amplifier may be added to each unit of the delta-sigma modulator 200. An example of such delta-sigma modulator 200 is described next.

Figure 13:
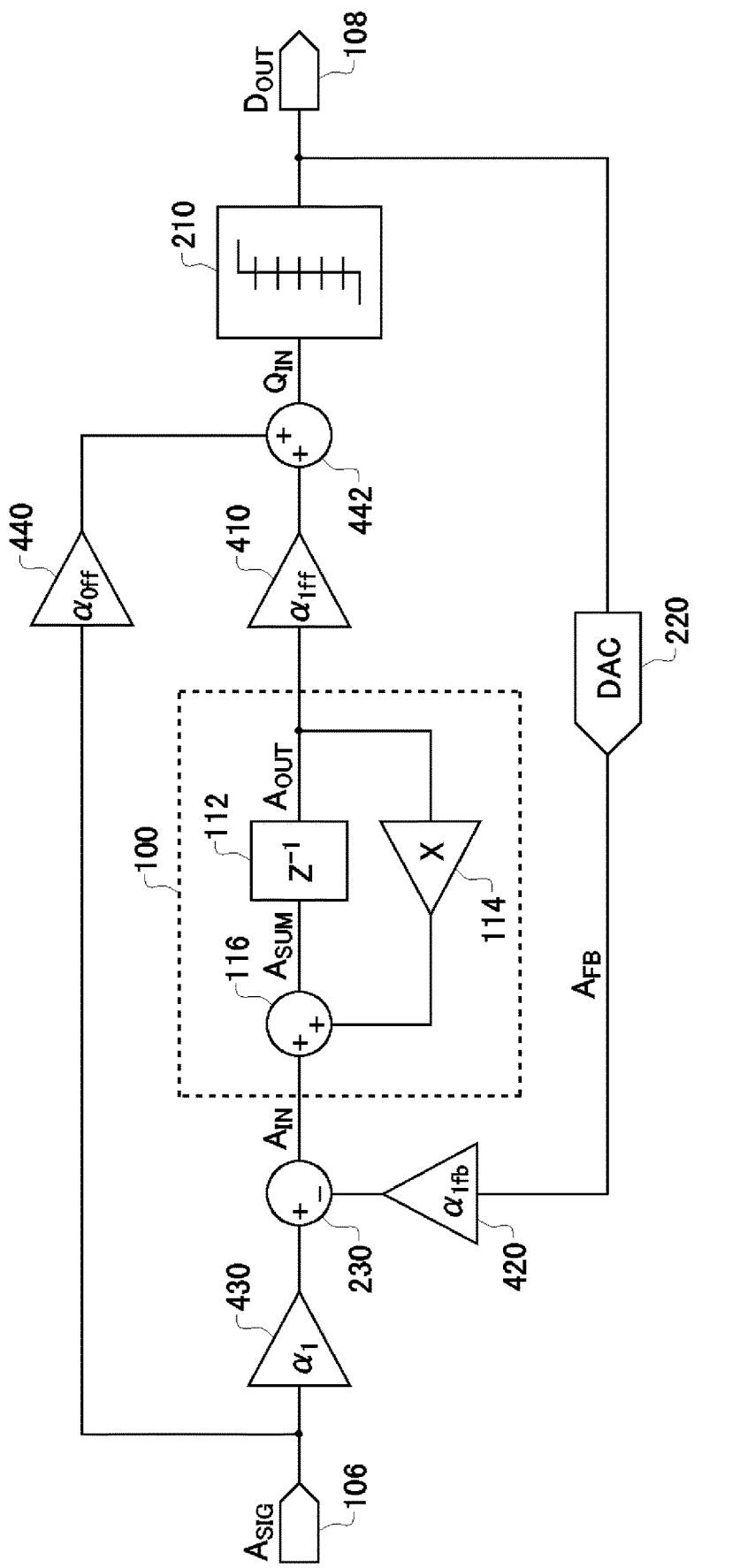
FIG. 13 illustrates a first modification example of the delta-sigma modulator 200 according to the present embodiment.

FIG. 13 illustrates a first modification example of the delta-sigma modulator 200 according to the present embodiment. The delta-sigma modulator 200 of the first modification example further includes a first amplifier 410 and a second amplifier 420.

The first amplifier 410 is provided between an analog amplifying unit 100 and a quantizer 210. The first amplifier 410 may amplify a signal input therein at an amplification factor $a_{1ff}$. The second amplifier 420 is provided between a DA converter 220 and an adder-subtractor 230. The second amplifier 420 may amplify a signal input therein at an amplification factor $a_{1fb}$. The delta-sigma modulator 200 may improve stability of a feedback loop by adjusting amplification factors of such amplifiers.

For example, a transfer function TF1 of a feedback path reaching to $A_{SUM}$ from an output $A_{OUT}$ of an analog amplifying unit 100 through the first amplifier 410, a quantizer 210, a DA converter 220, a second amplifier 420, an adder-subtractor 230, and an adder 116 is $-a_{1ff} \cdot a_{1fb}$. Also, a transfer function TF2 of a feedback path in an analog amplifying unit 100 from $A_{OUT}$ to $A_{SUM}$ corresponds to an amplification factor x. Accordingly, if a transfer function is TF in which all feedback paths reaching from $A_{OUT}$ to $A_{SUM}$ are taken into consideration, the following equation can be expressed.

$x = a_{1ff} \cdot a_{1fb}$. If this equation holds, the following equation also holds.

$$TF = TF1 + TF2 = 0 \quad \text{[Equation 29]}$$

Here, because the output $A_{OUT}$ of the analog amplifying unit 100 is obtained by delaying $A_{SUM}$, the following equation is established.

$$A_{OUT} = z^{-1} A_{SUM} \quad \text{[Equation 30]}$$

That is, if Equation 29 is established, the output $A_{OUT}$ of the analog amplifying unit 100 does not affect $A_{SUM}$ of a following clock. That is, an output $A_{OUT}$ in one clock timing does not affect an output $A_{OUT}$ in a following clock. Accordingly, if a product of an amplification factor $a_{1ff}$ of a first amplifier 410 and an amplification factor $a_{1fb}$ of a second amplifier 420 substantially matches an amplification factor x of an analog amplifying unit 100, which is a feedback coefficient, possibility of an output $A_{OUT}$ of an analog amplifying unit 100 to diverge and become unstable is reduced. Thereby, the analog amplifying unit 100 can stably operate.

Note that, the analog amplifying unit 100 may have a variable amplification factor x. For example, the analog amplifying unit 100 may have an amplification factor that changes at predetermined timing. Here, assume that an amplification factor of the analog amplifying unit 100 at the i-th clock timing is $x_i$, an input analog signal $A_{SIG}$ of the delta-sigma modulator 200 corresponds to Equation 25 and is expressed in the following equation.

$$A_{SIG} = \frac{\sum_{i=1}^{n}(x_i^{n-i} D_{OUT}(i))}{\sum_{i=1}^{n} x_i^{n-i}} + \frac{A_{OUT}}{\sum_{i=1}^{n} x_i^{n-i}} \quad \text{[Equation 31]}$$

A delta-sigma converter 300 using such delta-sigma modulator 200 can perform AD conversion corresponding to change of the amplification factor $x_i$, as a digital filter unit 310 operates in a manner expressed in the first term on the right side of Equation 31. Also, in this manner, if an amplification factor of an analog amplifying unit 100 is variable, amplification factors of the first amplifier 410 and the second amplifier 420 may also be variable in response to the change of the amplification factor $x_i$. That is, the analog amplifying unit 100 can stably operate as the amplification factors of the first amplifier 410 and the second amplifier 420 change in response to the change of the amplification factor $x_i$, such that Equation 29 is established.

Note that, the delta-sigma modulator 200 may further include a third amplifier 430, a fourth amplifier 440, and an adder 442. The third amplifier 430 amplifies an analog signal $A_{SIG}$ that is input into the delta-sigma modulator 200 and supplies it to an adder-subtractor 230. The third amplifier 430 may amplify a signal input therein at an amplification factor $a_1$. Also, the fourth amplifier 440 amplifies an analog signal $A_{SIG}$ that is input into the delta-sigma modulator 200 and supplies it to an adder 442. The fourth amplifier 440 may amplify a signal input therein at an amplification factor $a_{off}$. The adder 442 adds a signal amplified by the fourth amplifier 440 to output of the first amplifier 410, and supplies it to the quantizer 210. Note that, amplification factors of the third amplifier 430 and the fourth amplifier 440 may be variable.

Figure 14:
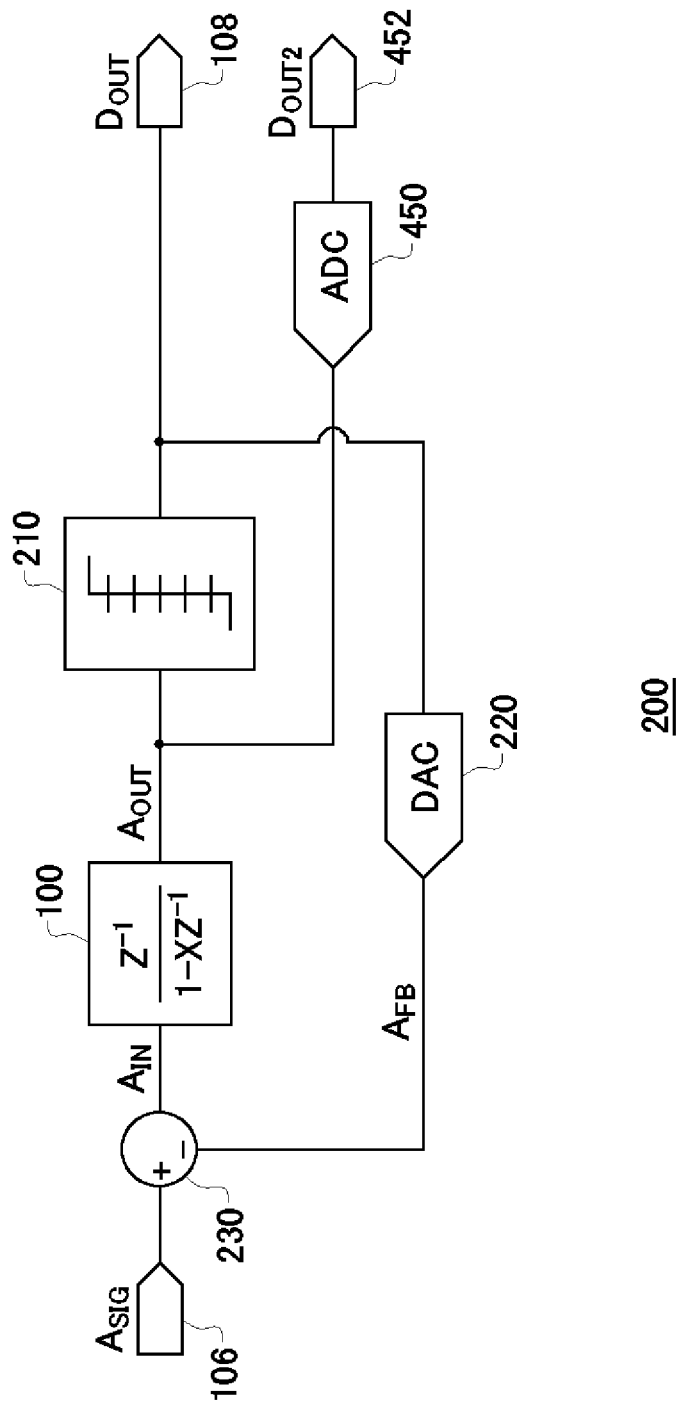
FIG. 14 illustrates a second modification example of the delta-sigma modulator 200 according to the present embodiment.

FIG. 14 illustrates a second modification example of the delta-sigma modulator 200 according to the present embodiment. The delta-sigma modulator 200 of the second modification example further includes an AD converting unit 450. As shown in Equation 27, a quantization error $E_1$ of the delta-sigma modulator 200 is a value that is in proportion to an output $A_{OUT}$ of an analog amplifying unit 100. That is, a digital value corresponding to the quantization error $E_1$ can be calculated by performing AD conversion on an output $A_{OUT}$ of the analog amplifying unit 100. Thereby, resolution can be further improved. Therefore, the delta-sigma modulator 200 of the second modification example converts the output $A_{OUT}$ of the analog amplifying unit 100 into a digital value.

An AD converting unit 450 converts the output signal $A_{OUT}$ of the analog amplifying unit 100 into a digital signal. The AD converting unit 450 may output the converted digital signal to an output terminal 452. The AD converting unit 450 may include an AD converter of successive approximation type, flash type, pipeline type, delta-sigma type, or the like. The AD converting unit 450 may include an AD converter added to a delta-sigma modulator 200, or instead of this, it may also be an AD converter using a quantizer 210. Assume that a bit number is m, a full scale is $A_{FS}$, and a quantization error of the AD converting unit 450 is $E_{ADC}$, a digital signal $D_{OUT2}$ output by the AD converting unit 450 is expressed in the following equation.

$$D_{OUT2} = A_{OUT} + E_{ADC} \quad \text{[Equation 32]}$$

-continued $$E_{ADC} < \frac{A_{FS}}{2^m}$$

By substituting an equation relating to the digital signal $D_{OUT2}$ of Equation 32 for Equation 25, the following equation is obtained.

$$A_{SIG} = \frac{\sum_{i=1}^{n}(x^{n-i}D_{OUT}(i))}{\frac{x^n-1}{x-1}} + \frac{D_{OUT2}}{\frac{x^n-1}{x-1}} + \frac{E_{ADC}}{\frac{x^n-1}{x-1}} \quad \text{[Equation 33]}$$

Also, by substituting an equation relating to the quantization error $E_{ADC}$ of Equation 32 for Equation 33, the following equation is obtained.

$$\left| A_{SIG} - \left( \frac{\sum_{i=1}^{n}(x^{n-i}D_{OUT}(i))}{\frac{x^n-1}{x-1}} + \frac{D_{OUT2}}{\frac{x^n-1}{x-1}} \right) \right| < \frac{A_{FS}}{2^m \frac{x^n-1}{x-1}} \quad \text{[Equation 34]}$$

As described above, the delta-sigma modulator 200 of the second modification example outputs the digital signal $D_{OUT}$ output by the quantizer 210 and the digital signal $D_{OUT2}$ obtained by performing the AD conversion on the output $A_{OUT}$ of the analog amplifying unit 100. Accordingly, a delta-sigma converter 300 having the delta-sigma modulator 200 of the second modification example can further improve resolution by m bit, by using the digital signal $D_{OUT}$ and the digital signal $D_{OUT2}$ to perform the digital operation. In this case, a digital filter unit 310 may perform digital processing that corresponds to the first term on the right side and the second term on the right of Equation 33.

Figure 15:
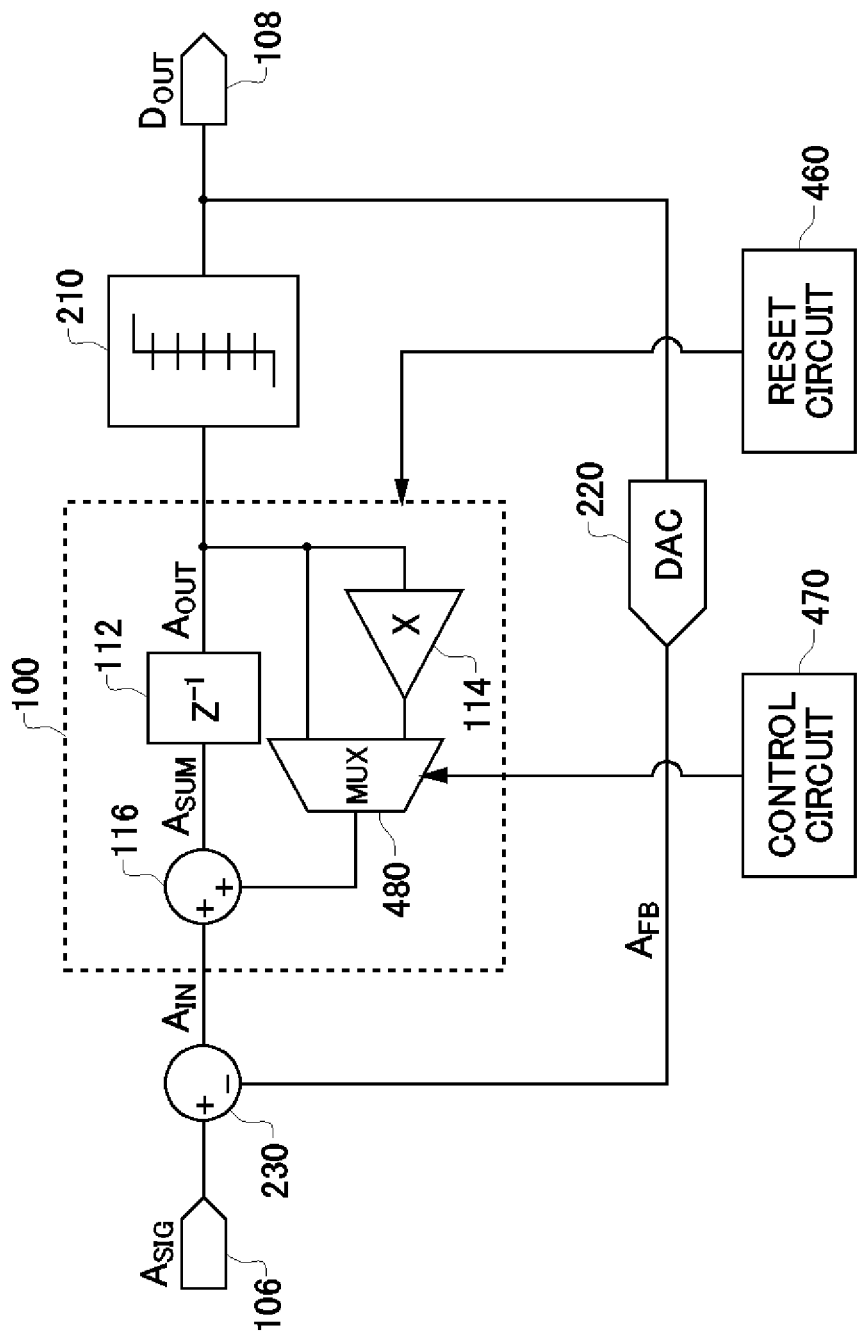
FIG. 15 illustrates a third modification example of the delta-sigma modulator 200 according to the present embodiment.

FIG. 15 illustrates a third modification example of the delta-sigma modulator 200 according to the present embodiment. The delta-sigma modulator 200 of the third modification example has a configuration in which an analog amplifying unit 100 switches between amplifying operation and operation of an integrator 10. The delta-sigma modulator 200 of the third modification example further includes a reset circuit 460 and a control circuit 470. The analog amplifying unit 100 further includes a switching circuit 480.

The reset circuit 460 resets an output $A_{OUT}$ of the analog amplifying unit 100 at predetermined periods. In this case, for example, the analog amplifying unit 100 connects between one of the input terminals of an analog amplifier 110 and an output terminal 104 to configure a feedback capacitor 120 to be resettable. Then, the reset circuit 460 may supply the analog amplifying unit 100 with a reset signal to reset the feedback capacitor 120. Also, if a delta-sigma modulator 200 is provided to the delta-sigma converter 300, the reset circuit 460 may also supply a reset signal to a digital filter unit 310.

The control circuit 470 supplies the switching circuit 480 with a control signal to switch operation of the analog amplifying unit 100. The control circuit 470 may switch operation of the analog amplifying unit 100 at predetermined timing. Also, the control circuit 470 may notify timing at which a reset signal should be supplied to the reset circuit 460.

The switching circuit 480 switches whether or not to insert an amplifier 114 in a feedback path depending on the control signal received from the control circuit 470. If the feedback path is free of an amplifier 114, the analog amplifying unit 100 has a similar configuration as that of the integrator 10 shown in FIG. 1, thus performs integral operation. Also, if an amplifier 114 is inserted in the feedback path, the analog amplifying unit 100 has a similar configuration as that of the analog amplifying unit 100 shown in FIG. 6, thus performs amplifying operation. That is, the switching circuit 480 switches whether to cause the analog amplifying unit 100 to perform integral operation or to perform amplifying operation depending on the control signal of the control circuit 470.

In the delta-sigma converter 300 according to the present embodiment, it has been described that AD conversion can be accurately performed as the digital filter unit 310 performs the operation expressed in Equation 26. Here, DC gain and a band of an actual amplifier are finite. Also, variation may occur in constants of electronic components and mismatch may occur in capacitance of condensers. Accordingly, if the delta-sigma converter 300 is implemented with an electronic component and actually operated, an amplification factor or the like of the analog amplifying unit 100 may shift from a design value. In this case, even if the digital filter unit 310 performs the operation expressed in Equation 26, it is an operation different from amplifying operation of the analog amplifying unit 100. Thereby, linearity or the like of AD conversion may be deteriorated.

On the other hand, the integrators 10 shown in FIG. 1 and FIG. 3 operate in a manner different from the amplifying operation of the analog amplifying unit 100. That is, even if variation occurs in capacitance of a feedback capacitor 24, a feedback coefficient is hardly ever shifted because integrated electric charges are held in the feedback capacitor 24. Therefore, the delta-sigma modulator 200 of the third modification example combines the integral operation and amplifying operation of the analog amplifying unit 100 and improves the linearity of the AD conversion. For example, the delta-sigma modulator 200 causes the analog amplifying unit 100 to perform integral operation in a predetermined period only.

The delta-sigma modulator 200 according to the present embodiment is described with reference to an example in which it causes the analog amplifying unit 100 to perform integral operation from when an analog amplifying unit 100 is reset to k-th time of a clock signal. In this case, with respect to the remaining (n-k) times of clock signals, the delta-sigma modulator 200 causes the analog amplifying unit 100 to perform amplifying operation and resets the analog amplifying unit 100 again at (n+1) time of the clock signal.

Here, if an initial value of an output signal $A_{OUT}$ of the analog amplifying unit 100 is zero, and an analog signal $A_{SIG}$ that is input to the delta-sigma modulator 200 is a substantially constant value, and assume that an i-th output of the quantizer 210 is $D_{OUT}(i)$, the output signal $A_{OUT}$ is expressed in the following equation.

$$A_{OUT} = \left( kx^{n-k} + \frac{x^{n-k}-1}{x-1} \right) A_{SIG} - \left( \sum_{i=1}^{k} x^{n-k}D_{OUT}(i) + \sum_{i=k+1}^{n}(x^{n-i}D_{OUT}(i)) \right) \quad \text{[Equation 35]}$$

By modifying Equation 35, the following equation is obtained. Note that, the quantization error is $E_2$ in the equation.

$$A_{SIG} = \frac{\sum_{i=1}^{k} x^{n-k} D_{OUT}(i) + \sum_{i=k+1}^{n} (x^{n-i} D_{OUT}(i))}{kx^{n-k} + \frac{x^{n-k}-1}{x-1}} + \frac{A_{OUT}}{kx^{n-k} + \frac{x^{n-k}-1}{x-1}}$$

$$E_2 = \frac{A_{OUT}}{kx^{n-k} + \frac{x^{n-k}-1}{x-1}}$$

[Equation 36]

Here, if a feedback loop of the delta-sigma modulator 200 is stabilized, it is possible to suppress the output signal $A_{OUT}$ of the analog amplifying unit 100 to be a value equal to or less than a substantially constant voltage value V. If it is stabilized accordingly, the quantization error $E_2$ of the delta-sigma modulator 200 of the third modification example is expressed in the following equation.

$$E_2 < \frac{V}{kx^{n-k} + \frac{x^{n-k}-1}{x-1}}$$

[Equation 37]

As described above, the delta-sigma modulator 200 of the third modification example reduces degradation of linearity while maintaining high resolution by causing the analog amplifying unit 100 to perform integral operation in a certain period only. For example, if n=10, k=5, and x=2, according to Equation 37, the delta-sigma modulator 200 of the third modification example has a quantization error $E_2$ of less than V/191. Thus, compared with the primary delta-sigma modulator 30 and the third delta-sigma modulator 30, the delta-sigma converter 300 using the delta-sigma modulator 200 of the third modification example can perform AD conversion of excellent linearity while maintaining high resolution.

Figure 16:
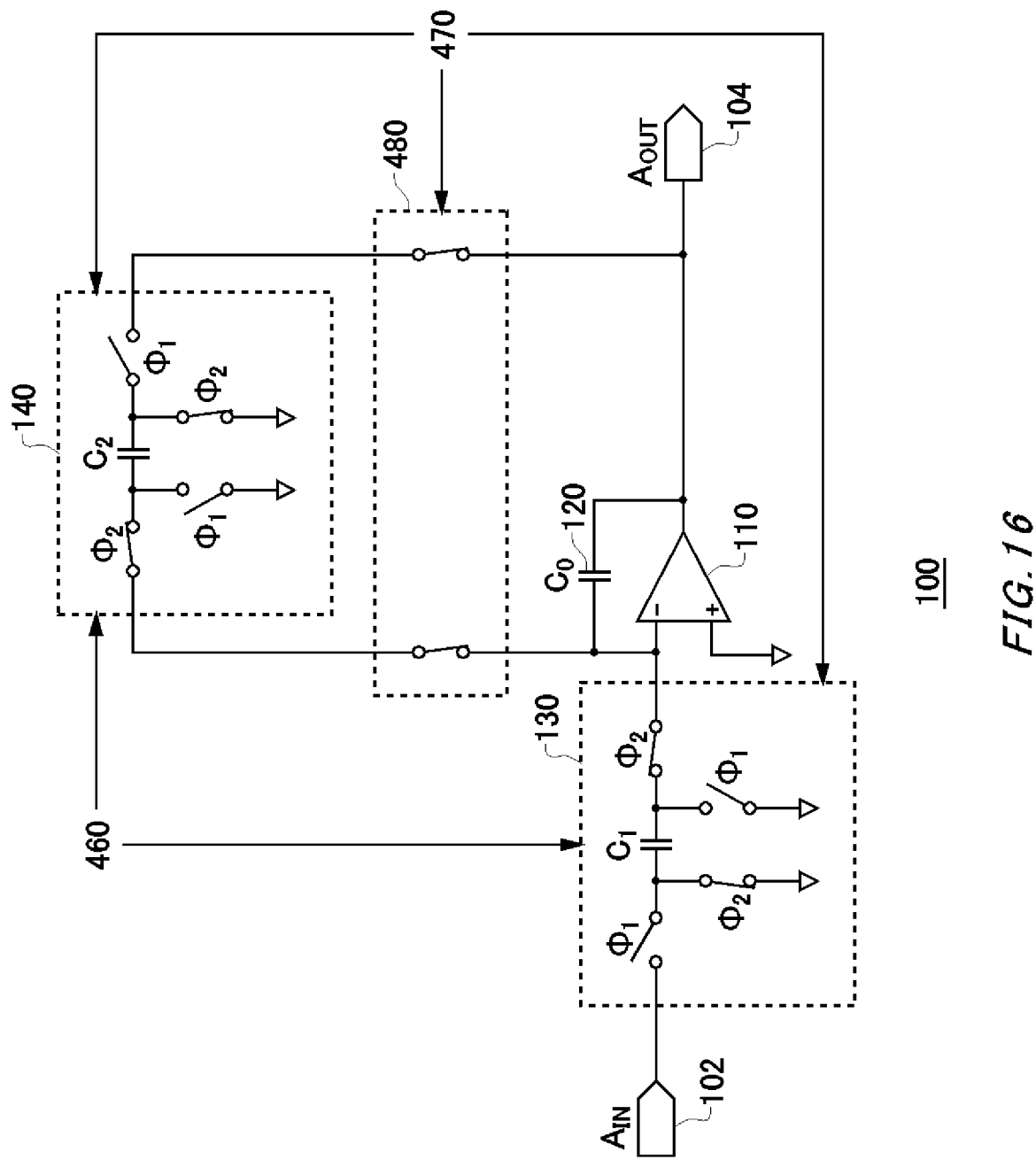
FIG. 16 illustrates an exemplary configuration of a real circuit of an analog amplifying unit 100 of the third modification example.

FIG. 16 illustrates an exemplary configuration of a real circuit of the analog amplifying unit 100 of the third modification example. In the analog amplifying unit 100 of the third modification example shown in FIG. 16, identical reference symbols are used for operation substantially the same as the operation of the analog amplifying unit 100 according to the present embodiment illustrated in FIG. 9, and description thereof is omitted. The analog amplifying unit 100 of the third modification example further has a switching circuit 480.

The switching circuit 480 switches whether or not to connect a second switched capacitor circuit 140 to a feedback circuit of an analog amplifier 110. If the switching circuit 480 electrically disconnects the second switched capacitor circuit 140 from the feedback circuit of the analog amplifier 110, the analog amplifying unit 100 performs integral operation. Also, if the switching circuit 480 electrically connects the second switched capacitor circuit 140 to the feedback circuit of the analog amplifier 110, the analog amplifying unit 100 performs amplifying operation. That is, the analog amplifying unit 100 of the third modification example switches whether to make a feedback coefficient greater than one or one.

A delta-sigma modulator 200 of the third modification example may control such switching circuit 480. For example, a control circuit 470 supplies the switching circuit 480 with a control signal to electrically disconnect between the second switched capacitor circuit 140 and the feedback circuit of the analog amplifier 110 from when an output $A_{OUT}$ of the analog amplifying unit 100 is reset until a predetermined period has elapsed. Also, the control circuit 470 supplies the switching circuit 480 with a control signal to electrically connect between the second switched capacitor circuit 140 and the feedback circuit of the analog amplifier 110 after the predetermined period has elapsed.

The delta-sigma modulator 200 according to the present embodiment described above is described with reference to the example in which the analog amplifying unit 100 is made to have an configuration shown in FIG. 9 to perform amplifying operation. In this case, load of both a first capacitor $C_1$ and a second capacitor $C_2$ is applied to one of the input terminals of the analog amplifier 110 during a period φ2. A transfer function in this case will be described next.

Figure 17:
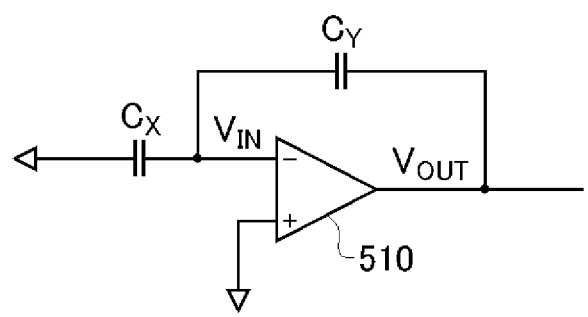
FIG. 17 illustrates one example of an operational amplifier circuit 500.

FIG. 17 illustrates one example of an operational amplifier circuit 500. The operational amplifier circuit 500 includes an operational amplifier 510, a third capacitor $C_x$, and a fourth capacitor $C_y$. The operational amplifier 510 has one input connected to one end of the third capacitor $C_x$, and the other input connected to reference potential. Assume that potential of the one input of the operational amplifier 510 is $V_{IN}$, and potential of output is $V_{OUT}$. The other end of the third capacitor $C_x$ is supplied with an input signal that is input into the operational amplifier circuit 500. The fourth capacitor $C_y$ is provided between the one input and output of the operational amplifier 510.

A transfer function from an output $V_{OUT}$ to an input $V_{IN}$ of the operational amplifier 510 in such operational amplifier circuit 500 is expressed in the following equation.

$$\frac{V_{IN}}{V_{OUT}} = \frac{C_y}{C_x + C_y} = \frac{1}{1 + \frac{C_x}{C_y}}$$

[Equation 38]

That is, a gain-bandwidth product to be fed back to the input $V_{IN}$ of the operational amplifier 510 is reduced by an amount shown in Equation 38. Thereby, the larger $C_x/C_y$ is, which is a capacitance ratio of the third capacitor $C_x$ and the fourth capacitor $C_y$, the higher the gain-bandwidth product is required for the operational amplifier 510. Accordingly, power consumption of the operational amplifier 510 is increased. If applying the example of the operational amplifier circuit 500 of FIG. 17 to the analog amplifying unit 100 shown in FIG. 9, the following equation is established during a period φ2.

$$C_x = C_1 + C_2$$

$$C_y = C_0$$

[Equation 39]

That is, in the analog amplifying unit 100 in the present embodiment, power consumption of the analog amplifier 110 is increased by adding a second capacitor $C_2$. Therefore, if the second capacitor $C_2$ is added, capacitance of a first capacitor $C_1$ may be adjusted and the capacitance ratio $C_x/C_y$ may be prevented from being increased.

Note that, as shown in FIG. 13, if a delta-sigma modulator 200 includes a third amplifier 430 on an input terminal 106 side, it is desirable that a capacitance ratio of a feedback capacitor 120 and a first capacitor $C_1$ corresponds to an amplification factor $a_1$ of a third amplifier 430 as expressed in the following equation.

$$\frac{C_1}{C_0} = a_1 \qquad \text{[Equation 40]}$$

Therefore, if the control circuit 470 switches the capacitance of the first capacitor $C_1$, the amplification factor $a_1$ of the third amplifier 430 may further be adjusted. Such delta-sigma modulator 200 is described next.

Figure 18:
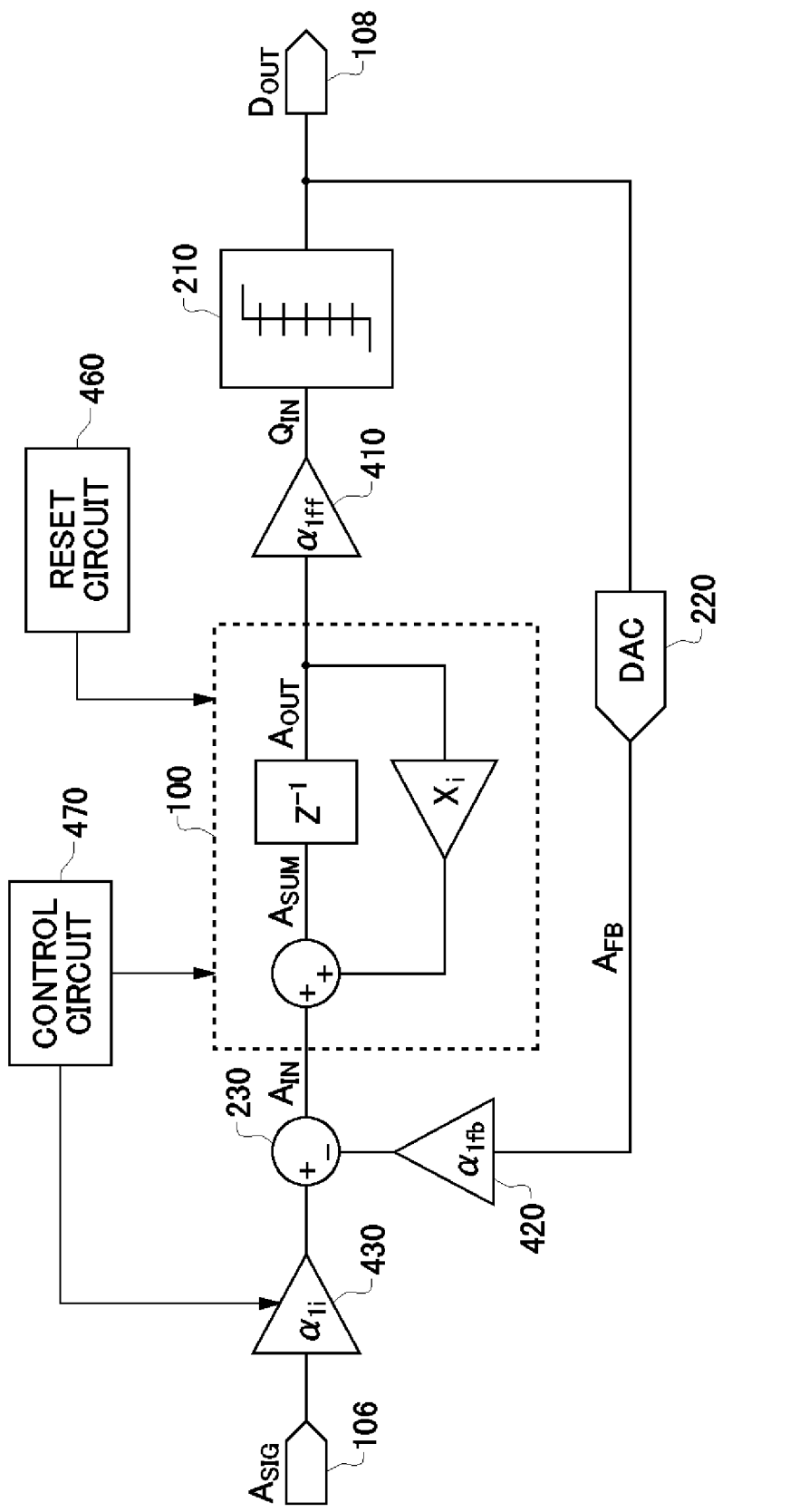
FIG. 18 illustrates a fourth modification example of the delta-sigma modulator 200 according to the present embodiment.

FIG. 18 illustrates a fourth modification example of the delta-sigma modulator 200 according to the present embodiment. The delta-sigma modulator 200 of the fourth modification example includes a third amplifier 430 having a variable amplification factor. In the delta-sigma modulator 200 of the fourth modification example, the control circuit 470 switches between periods ϕ1 and periods ϕ2 of the first switched capacitor circuit 130 and the second switched capacitor circuit 140.

Also, the control circuit 470 switches an amplification factor $a_1$ of the third amplifier 430 together with switching of capacitance of the first capacitor $C_1$. Here, in response to the control circuit 470 adjusting the amplification factor of the third amplifier 430 depending on the i-th clock, the amplification factor is shown as $a_{1i}$ in FIG. 18. The control circuit 470 may switch the amplification factor $a_{1i}$ so as to establish Equation 40.

Instead of this, the control circuit 470 may make the amplification factor $a_{1i}$ be zero in a predetermined period. Note that, the adjustment of the amplification factor of the third amplifier 430 performed by such control circuit 470 may be performed in parallel with the switching between integral operation and amplifying operation of the analog amplifying unit 100 described in FIG. 15. Accordingly, in response to the integral operation and the amplifying operation of the analog amplifying unit 100 being switched depending on the i-th clock, an amplification factor of the analog amplifying unit 100 is shown as $x_i$ in FIG. 18.

Here, assume that n clock signals are supplied to the analog amplifying unit 100 from when one reset signal is supplied to the analog amplifying unit 100 by the reset circuit 460 to when the following reset signal is supplied thereto. Then, an example in which an analog amplifying unit 100 is caused to perform integral operation from a first to k-th clock signals among the n clocks, and the analog amplifying unit 100 is caused to perform amplifying operation from (k+1)-th to n-th clock signals at amplification factor x is described.

In this case, with respect to the first to k-th clock signals, the control circuit 470 electrically disconnect between a second switched capacitor circuit 140 of the analog amplifying unit 100 and a feedback circuit of the analog amplifier 110. In this case, the control circuit 470 makes the amplification factor $a_{1i}$ of the third amplifier 430 be a value that is based on a ratio of the first capacitor and the feedback capacitor. For example, the control circuit 470 makes the amplification factor $a_{1i}$ be as expressed in the following equation.

$$a_{1i} = \frac{C_1}{C_0} = x - 1 \qquad \text{[Equation 41]}$$

Then, with respect to (k+1)-th to n-th clock signals, the control circuit 470 electrically connect between the second switched capacitor circuit 140 of the analog amplifying unit 100 and the feedback circuit of the analog amplifier 110. In this case, the control circuit 470 makes the amplification factor $a_{1i}$ of the third amplifier 430 be zero, that is to say, no input is made.

$$a_{1i} = 0 \qquad \text{[Equation 42]}$$

Here, if a second capacitor $C_2$ is defined to satisfy (Equation 19), the following equation is established from (Equation 19) and (Equation 41).

$$C_1 = C_2 \qquad \text{[Equation 43]}$$

Thereby, $C_x = C_1$ from the first to the k-th clock signals, and $C_x = C_2$ from the (k+1)-th to the n-th clock signals. However, because $C_1 = C_2$, $C_x$ is constantly equal from the first to the n-th clock signals, and thus load of the analog amplifier 110 can be maintained substantially constant. Here, if an initial value of an output signal $A_{OUT}$ of the analog amplifying unit 100 is zero, and an analog signal $A_{SIG}$ that is input into the delta-sigma modulator 200 is a substantially constant value, and assume that an i-th output of a quantizer 210 is $D_{OUT}(i)$, the output signal $A_{OUT}$ is expressed in the following equation.

$$A_{OUT} = kx^{n-k} A_{SIG} - \left( \sum_{i=1}^{k} x^{n-k} D_{OUT}(i) + \sum_{i=k+1}^{n} (x^{n-i} D_{OUT}(i)) \right) \qquad \text{[Equation 44]}$$

By modifying Equation 44, the following equation is obtained. Note that, a quantization error is $E_3$ in the equation.

$$A_{SIG} = \frac{\sum_{i=1}^{k} x^{n-k} D_{OUT}(i) + \sum_{i=k+1}^{n} (x^{n-i} D_{OUT}(i))}{kx^{n-k}} + \frac{A_{OUT}}{kx^{n-k}}$$

$$E_3 = \frac{A_{OUT}}{kx^{n-k}} \qquad \text{[Equation 45]}$$

Here, if a feedback loop of the delta-sigma modulator 200 is stabilized, it is possible to suppress the output signal $A_{OUT}$ of the analog amplifying unit 100 to be a value equal to or less than a substantially constant voltage value V. If it is stabilized accordingly, the quantization error $E_3$ of the delta-sigma modulator 200 of the fourth modification example is expressed in the following equation.

$$E_3 < \frac{V}{kx^{n-k}} \qquad \text{[Equation 46]}$$

In an example in which it is assumed that n=10, k=5, x=2, the amplification factor $a_{1i}$ of the third amplifier 430 has a value that is not zero from the first to the fifth clocks, and the amplification factor $a_{1i}$ of the third amplifier 430 is zero from the sixth to the tenth clocks, the quantization error $E_3$ is calculated in the following equation.

$$E_3 < \frac{V}{160} \qquad \text{[Equation 47]}$$

In the present embodiment, because the control circuit 470 makes the amplification factor $a_{1i}$ of the third amplifier 430 be zero, amplification of the analog amplifying unit 100 for an input analog signal is reduced and thus resolution is reduced. However, compared to a result of less than V/191, which is calculated from Equation 37, reduction of resolution is little in this case as shown in Equation 46. Also, compared with the primary delta-sigma modulator 30 and the third delta-sigma modulator 30, it can be seen that the delta-sigma converter 300 using the delta-sigma modulator 200 of the fourth modification example performs AD conversion of excellent linearity while maintaining high resolution.

The delta-sigma modulator 200 of the present embodiment described above is described with reference to the exemplary configuration in which it operates as a delta-sigma modulator of a discrete-time system using a switched capacitor circuit. However, it shall not be construed as a limiting example. The delta-sigma modulator 200 may also operate as a delta-sigma modulator of a continuous time system. For example, the integrator 10 shown in FIG. 3 operates as an integrator of a continuous time system by replacing the switched capacitor circuit 26 with a voltage-current converting circuit.

Figure 19:
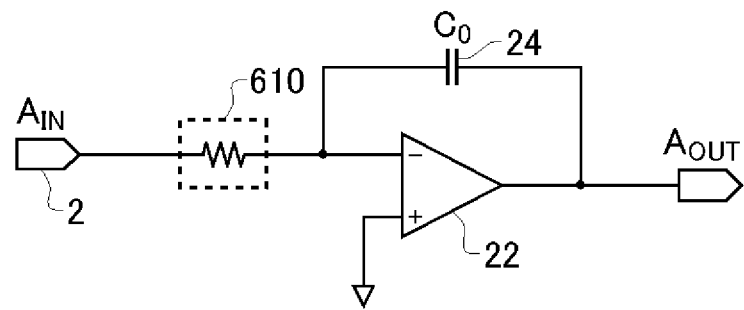
FIG. 19 illustrates an exemplary configuration of an integrator 600 in a continuous time system according to the present embodiment.

FIG. 19 illustrates an exemplary configuration of an integrator 600 in a continuous time system according to the present embodiment. In the integrator 600 shown in FIG. 19, identical reference symbols are used for operation substantially the same as the operation of the integrator 10 according to the present embodiment illustrated in FIG. 3, and description thereof is omitted. The integrator 600 shows an example in which the switched capacitor circuit 26 of the integrator 10 shown in FIG. 3 is replaced with a first voltage-current converting circuit 610. Note that, FIG. 19 illustrates an example in which the first voltage-current converting circuit 610 is a resistor element. Accordingly, because the integrator 600 operates as an integrator of a continuous time system, an analog amplifying unit 100 used by a delta-sigma modulator 200 can also be configured as a modulator of a continuous time system by performing replacement of the same kind.

Figure 20:
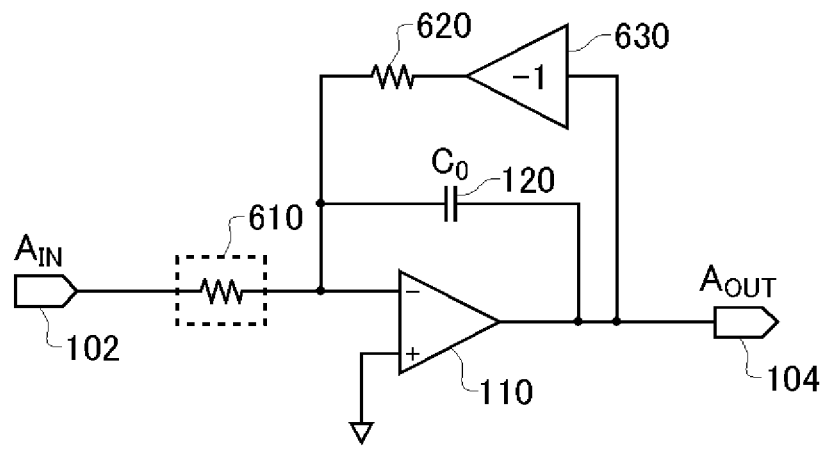
FIG. 20 illustrates an exemplary configuration of an analog amplifying unit 700 in a continuous time system according to the present embodiment.

FIG. 20 illustrates an exemplary configuration of an analog amplifying unit 700 in a continuous time system according to the present embodiment. In the analog amplifying unit 700 shown in FIG. 20, identical reference symbols are used for operation substantially the same as the operation of the analog amplifying unit 100 according to the present embodiment illustrated in FIG. 9, and description thereof is omitted. The analog amplifying unit 700 shows an example in which the first switched capacitor circuit 130 is replaced with a first voltage-current converting circuit 610. Also, the analog amplifying unit 700 shows an example in which the second switched capacitor circuit 140 is replaced with a second voltage-current converting circuit 620 and an amplifier circuit 630.

The analog amplifying unit 700 functions as a RC integrating circuit. In this case, because a gain from input to output is negative, the analog amplifying unit 700 inserts an amplifier circuit 630 having −1 time amplification degree to cause positive feedback operation. A delta-sigma modulator 200 according to the present embodiment can operate as a delta-sigma modulator of a continuous time system by including such analog amplifying unit 700 therein. Also, a delta-sigma converter 300 may use such delta-sigma modulator 200.

Figure 21:
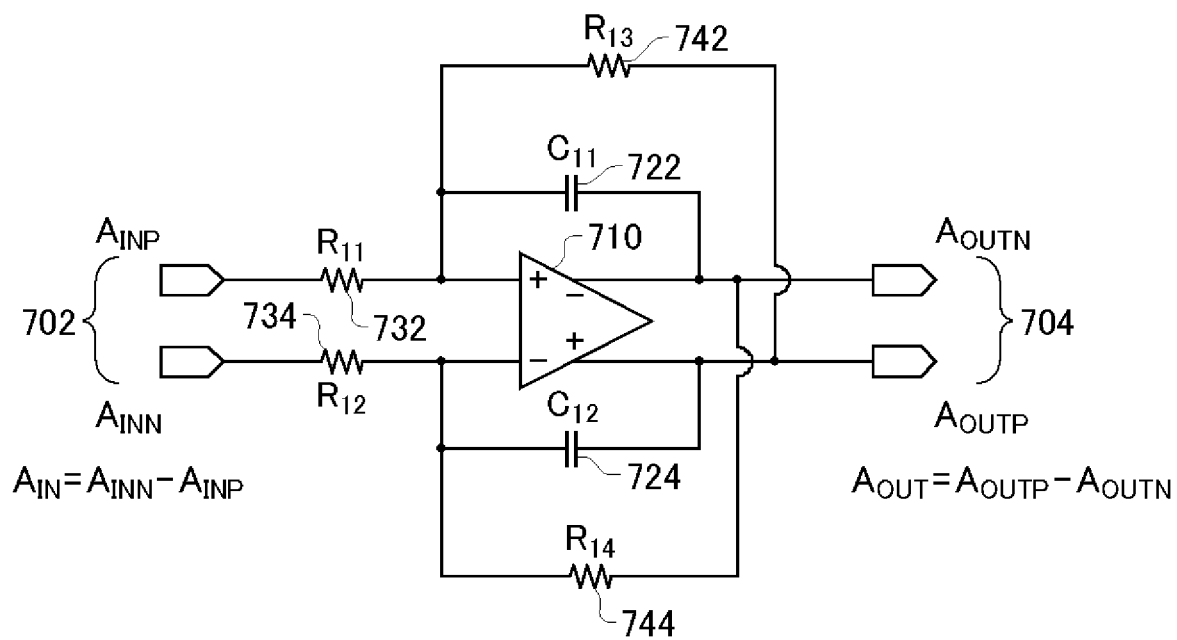
FIG. 21 illustrates an exemplary configuration of a full differential circuit of the analog amplifying unit 700 according to the present embodiment.

FIG. 21 illustrates an exemplary configuration of a full differential circuit of the analog amplifying unit 700 according to the present embodiment. The analog amplifying unit 700 includes a differential input terminal 702, a differential output terminal 704, an analog amplifier 710, a first feedback capacitor 722, a second feedback capacitor 724, a positive side first voltage-current converting circuit 732, a negative side first voltage-current converting circuit 734, a positive side second voltage-current converting circuit 742, and a negative side second voltage-current converting circuit 744.

The analog amplifier 710 is provided between the differential input terminal 702 and the differential output terminal 704. The analog amplifier 710 may be an operational amplifier or the like. Differential input terminals of the analog amplifier 710 receive differential signals from the differential input terminal 702 via a positive side first voltage-current converting circuit 732 and a negative side first voltage-current converting circuit 734. Differential output terminals of an analog amplifier 710 are connected to the differential output terminal 704.

The first feedback capacitor 722 is provided between an input terminal on a positive side and an output terminal on a negative side of the analog amplifier 710 and forms a part of a feedback circuit. Also, the second feedback capacitor 724 is provided between an input terminal on a negative side and an output terminal on a positive side of the analog amplifier 710 and forms a part of a feedback circuit.

The positive side first voltage-current converting circuit 732 and the negative side first voltage-current converting circuit 734 are provided between the differential input terminal 702 and the analog amplifier 710. Output of the positive side first voltage-current converting circuit 732 and the negative side first voltage-current converting circuit 734 are connected to differential input terminals of the analog amplifier respectively. That is, the positive side first voltage-current converting circuit 732 and the analog amplifier are connected in series in a circuit on a positive side between the differential input terminal 702 and the differential output terminal 704. Also, the negative side first voltage-current converting circuit 734 and the analog amplifier are connected in series in a circuit on a negative side between the differential input terminal 702 and the differential output terminal 704. The positive side first voltage-current converting circuit 732 and the negative side first voltage-current converting circuit 734 respectively include resistor elements to perform voltage-current conversion on a signal input therein.

The positive side second voltage-current converting circuit 742 is provided between the input terminal on the positive side and the output terminal on the positive side of the analog amplifier 710. The negative side second voltage-current converting circuit 744 is provided between the input terminal on the negative side and the output terminal on the negative side of the analog amplifier 710. The positive side second voltage-current converting circuit 742 and the negative side second voltage-current converting circuit 744 include resistor elements to perform voltage-current conversion on a signal input therein.

The analog amplifying unit 700 described above functions as a RC integrating circuit. In this case, because input and output are connected such that a gain becomes positive, it performs positive feedback operation. A delta-sigma modulator 200 according to the present embodiment can operate as a delta-sigma modulator of a continuous time system by including such analog amplifying unit 700 therein. Also, a delta-sigma converter 300 may use such delta-sigma modulator 200.

Various embodiments of the present invention described above may be described with reference to flow charts and block diagrams. Blocks in the flow charts and block diagrams may be represented as (1) steps of processes in which operations are performed or (2) "units" of apparatuses responsible for performing the operations. Certain steps and "units" may be implemented by a dedicated circuit, a programmable circuit supplied together with a computer readable instruction stored on a computer readable storage media, and/or a processor supplied together with a computer readable instruction stored on a computer readable storage media.

Note that, the dedicated circuit may include a digital and/or analog hardware circuit and may include an integrated circuit (IC) and/or a discrete circuit. For example, the programmable circuit may include a reconfigurable hardware circuit such as a field-programmable gate array (FPGA), a programmable logic array (PLA), or the like including AND, OR, XOR, NAND, NOR, and other logical operation, a flip-flop, a register, and a memory element.

The computer readable storage media may include any tangible device that can store an instruction executed by a suitable device. Thereby, the computer readable storage medium having the instruction stored in the tangible device includes the product including the instruction that can be executed to create means for performing the operation specified in the flow charts or block diagrams.

Examples of the computer readable storage media may include an electronic storage medium, a magnetic storage medium, an optical storage medium, an electromagnetic storage medium, a semiconductor storage medium, and the like. More specific examples of the computer readable storage media may include a floppy disk, a diskette, a hard disk, a random access memory (RAM), a read-only memory (ROM), an erasable programmable read-only memory (EPROM or flash memory), an electrically erasable programmable read-only memory (EEPROM), a static random access memory (SRAM), a compact disc read-only memory (CD-ROM), a digital versatile disk (DVD), a BLU-RAY (registered trademark) disc, a memory stick, an integrated circuit card, and the like.

The computer readable instruction may include an assembler instruction, an instruction set architecture (ISA) instruction, a machine instruction, a machine dependent instruction, a microcode, a firmware instruction, state setting data etc. Also, the computer readable instruction may include source code or object code written in any combination of one or more programming languages, including an object oriented programming language such as Smalltalk, JAVA (registered trademark), C++, etc., and conventional procedural programming languages, such as the "C" programming language or similar programming languages.

The computer readable instruction may be locally provided to a processor of a general purpose computer, special purpose computer, or other programmable data processing apparatus, or to a programmable circuit, or provided via a local area network (LAN), or a wide area network (WAN) such as the Internet, etc. Thereby, a processor of a general purpose computer, special purpose computer, or other programmable data processing apparatus, or a programmable circuit can execute the computer readable instruction to create the means for performing the operation specified in the flow charts or block diagrams. Note that, examples of the processor include a computer processor, a processing unit, a microprocessor, a digital signal processor, a controller, a microcontroller, etc.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A delta-sigma modulator comprising:
    an analog amplifying unit to amplify an analog signal, the analog amplifying unit having at least a primary feedback coefficient;
    a quantizer to quantize an output signal of the analog amplifying unit;
    a DA converter to perform DA conversion on output of the quantizer and output a feedback signal to be fed back to the analog amplifying unit;
    an adder-subtractor to input into the analog amplifying unit an analog signal obtained by subtracting the feedback signal from an analog signal input therein;
    a reset circuit to reset the analog amplifying unit at predetermined periods; and
    a control circuit to control the analog amplifying unit so that during a period from resetting the analog amplifying unit to subsequently resetting the analog amplifying unit the analog amplifying unit operates as an integrator with the primary feedback coefficient of 1 during a first half of the period, and the analog amplifying unit operates as an amplifier with the primary feedback coefficient of greater than one during a second half of the period.

2. The delta-sigma modulator according to claim 1, wherein the analog amplifying unit includes:
    an analog amplifier provided between an input terminal and an output terminal;
    a first switched capacitor circuit provided between the input terminal and the analog amplifier and including a first capacitor; and
    a second switched capacitor circuit including a second capacitor and a feedback capacitor provided in parallel as a feedback circuit of the analog amplifier.

3. The delta-sigma modulator according to claim 1, wherein the analog amplifying unit includes:
    an analog amplifier provided between an input terminal and an output terminal;
    a first voltage-current converting circuit provided between the input terminal and the analog amplifier; and
    a second voltage-current converting circuit and a feedback capacitor provided in parallel as a feedback circuit of the analog amplifier.

4. The delta-sigma modulator according to claim 1, wherein the analog amplifying unit has a variable amplification factor.

5. The delta-sigma modulator according to claim 1, further comprising
   a third amplifier to amplify the analog signal input therein to supply the amplified analog signal to the adder-subtractor, wherein
   the third amplifier has a variable amplification factor.

6. The delta-sigma modulator according to claim 5, wherein
   when the control circuit sets the feedback coefficient of the analog amplifying unit to a number greater than one, the control circuit sets the amplification factor of the third amplifier to zero so that the third amplifier does not supply the analog signal.

7. The delta-sigma modulator according to claim 1, comprising
   an AD converting unit to convert the output signal of the analog amplifying unit into a digital signal.

8. A delta-sigma converter comprising:
   the delta-sigma modulator according to claim 1; and
   a digital filter unit to filter a digital modulation signal output by the delta-sigma modulator.

9. The delta-sigma converter according to claim 8, wherein
   the digital filter unit performs a digital operation equivalent to amplifying operation of the analog amplifying unit.

10. A delta-sigma modulator comprising:
    an analog amplifying unit to amplify an analog signal, the analog amplifying unit having at least a primary feedback coefficient;
    a quantizer to quantize an output signal of the analog amplifying unit;
    a DA converter to perform DA conversion on output of the quantizer and output a feedback signal to be fed back to the analog amplifying unit;
    an adder-subtractor to input into the analog amplifying unit an analog signal obtained by subtracting the feedback signal from an analog signal input therein;
    a reset circuit to reset the analog amplifying unit at predetermined periods; and
    a control circuit to control the analog amplifying unit so that the analog amplifying unit operates as an integrator with the primary feedback coefficient of 1 until a predetermined period of time elapses after the reset circuit resets the analog amplifying unit and as an amplifier with the primary feedback coefficient of greater than one after the predetermined period of time has elapsed;
    a first amplifier provided between the analog amplifying unit and the quantizer; and
    a second amplifier provided between the DA converter and the adder-subtractor.

11. The delta-sigma modulator according to claim 10, wherein a product of an amplification factor of the first amplifier and an amplification factor of the second amplifier is equal to the feedback coefficient.

12. A delta-sigma modulator comprising:
    an analog amplifying unit to amplify an analog signal, the analog amplifying unit having at least a primary feedback coefficient;
    a quantizer to quantize an output signal of the analog amplifying unit;
    a DA converter to perform DA conversion on output of the quantizer and output a feedback signal to be fed back to the analog amplifying unit;
    an adder-subtractor to input into the analog amplifying unit an analog signal obtained by subtracting the feedback signal from an analog signal input therein; and
    a control circuit to control the analog amplifying unit so that the analog amplifying unit operates as an integrator with the primary feedback coefficient of 1 during a first half of one sampling period and as an amplifier with the primary feedback coefficient of greater than one during a second half of the one sampling period.

* * * * *